United States Patent
Endo

(10) Patent No.: US 9,245,536 B2
(45) Date of Patent: Jan. 26, 2016

(54) ADJUSTMENT APPARATUS AND METHOD

(71) Applicant: FUJITSU LIMITED, Kawasaki-shi, Kanagawa (JP)

(72) Inventor: Kaori Endo, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 213 days.

(21) Appl. No.: 13/923,844

(22) Filed: Jun. 21, 2013

(65) Prior Publication Data

US 2014/0067383 A1    Mar. 6, 2014

(30) Foreign Application Priority Data

Sep. 5, 2012   (JP) ................................ 2012-195173

(51) Int. Cl.
| | |
|---|---|
| G10L 21/00 | (2013.01) |
| G10L 21/02 | (2013.01) |
| H03G 9/00 | (2006.01) |
| G10L 21/0364 | (2013.01) |
| G10L 21/0232 | (2013.01) |

(52) U.S. Cl.
CPC ............ *G10L 21/02* (2013.01); *G10L 21/0232* (2013.01); *G10L 21/0364* (2013.01); *H03G 9/005* (2013.01)

(58) Field of Classification Search
CPC . H03G 9/005; G10L 21/0232; G10L 21/0364
See application file for complete search history.

(56) References Cited

U.S. PATENT DOCUMENTS

| | | | |
|---|---|---|---|
| 8,015,002 B2* | 9/2011 | Li et al. .................... | 704/226 |
| 2007/0265840 A1 | 11/2007 | Matsubara et al. | |
| 2009/0111507 A1* | 4/2009 | Chen .......................... | 455/550.1 |
| 2010/0195745 A1* | 8/2010 | Gupta et al. ................. | 375/257 |
| 2012/0014539 A1* | 1/2012 | Inazumi et al. .............. | 381/107 |

FOREIGN PATENT DOCUMENTS

| | | |
|---|---|---|
| EP | 0740410 A1 | 10/1996 |
| EP | 2141695 | 1/2010 |
| JP | 2009-104140 | 5/2009 |
| JP | 2010-092057 | 4/2010 |
| JP | 4519169 B2 | 8/2010 |

OTHER PUBLICATIONS

Extended European Search Report of European Patent Application No. 13173160.6, dated Feb. 13, 2014.

* cited by examiner

*Primary Examiner* — Daniel Abebe
(74) *Attorney, Agent, or Firm* — Fujitsu Patent Center

(57) ABSTRACT

A disclosed adjustment apparatus includes: a calculation unit that calculates a ratio between a first frequency characteristic in a first frequency bandwidth of voice signals and a second frequency characteristic in a second frequency bandwidth of the voice signals, which is higher than the first frequency bandwidth, and calculates an adjustment amount for adjusting at least a portion of a frequency characteristic of the voice signals so that the calculated ratio approaches a predetermined reference, when the calculated ratio does not satisfy the predetermined reference; and a modification unit that modifies at least the portion of the frequency characteristic of the voice signals according to the adjustment amount.

5 Claims, 19 Drawing Sheets

ADJUSTMENT APPARATUS AND METHOD

CROSS-REFERENCE TO RELATED APPLICATIONS

This application is based upon and claims the benefit of priority of the prior Japanese Patent Application No. 2012-195173, filed on Sep. 5, 2012, the entire contents of which are incorporated herein by reference.

FIELD

This invention relates to a technique for adjusting a voice signal.

BACKGROUND

In order to reduce noises and clarify a voice, a gain of a specific frequency is adjusted. A certain conventional document discloses a technique for presuming a noise for each frequency and removing the background noise in order to make it easy to hear received voice. The noise is modeled by a straight line regarding the frequencies and using an inclination and intercept as parameters. The modeling is performed for each of a bandwidth from sound intermediate frequencies to low frequencies and a bandwidth of high frequencies.

Moreover, another conventional document discloses a technique for emphasizing a formant in order to make it easy to hear received voices. In this document, formant frequencies of input voices are analyzed and emphasized to enhance clearness of the received voices. The formant is a property concerning sounds in case of speaking a language.

It is possible to enhance easiness to hear by suppressing the background noises that are mixed into the received voices and emphasizing the formants of the received voices.

However, in addition to the background noises and the property of speaking, there is a factor that makes it difficult to hear reproduced voices of the voice signals.

In other words, the conventional techniques cannot sufficiently solve the difficulty to hear the reproduced voices.

SUMMARY

An adjustment apparatus relating to one mode of this invention includes: (A) a calculation unit that calculates a ratio between a first frequency characteristic in a first frequency bandwidth of voice signals and a second frequency characteristic in a second frequency bandwidth of the voice signals, which is higher than the first frequency bandwidth, and calculates an adjustment amount for adjusting at least a portion of a frequency characteristic of the voice signals so that the calculated ratio approaches a predetermined reference, when the calculated ratio does not satisfy the predetermined reference; and (B) a modification unit that modifies at least the portion of the frequency characteristic of the voice signals according to the adjustment amount.

An adjustment apparatus relating to another mode of this invention includes: (C) a calculation unit that calculates a first ratio between a first frequency characteristic in a first frequency bandwidth of voice signals and a second frequency characteristic in a second frequency bandwidth of the voice signals, which is higher than the first frequency bandwidth, calculates a second ratio between the first frequency characteristic and a third frequency characteristic in a third frequency bandwidth of the voice signals, which is higher than the second frequency bandwidth, calculates an adjustment amount for adjusting at least a portion of a frequency characteristic of the voice signals so that the calculated first ratio approaches a first reference, when the calculated first ratio does not satisfy the first reference, or so that the calculated second ratio approaches a second reference, when the calculated second ratio does not satisfy the second reference; and (D) a modification unit that modifies at least the portion of the frequency characteristic of the voice signals according to the adjustment amount.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Embodiment 1

Figure 1:
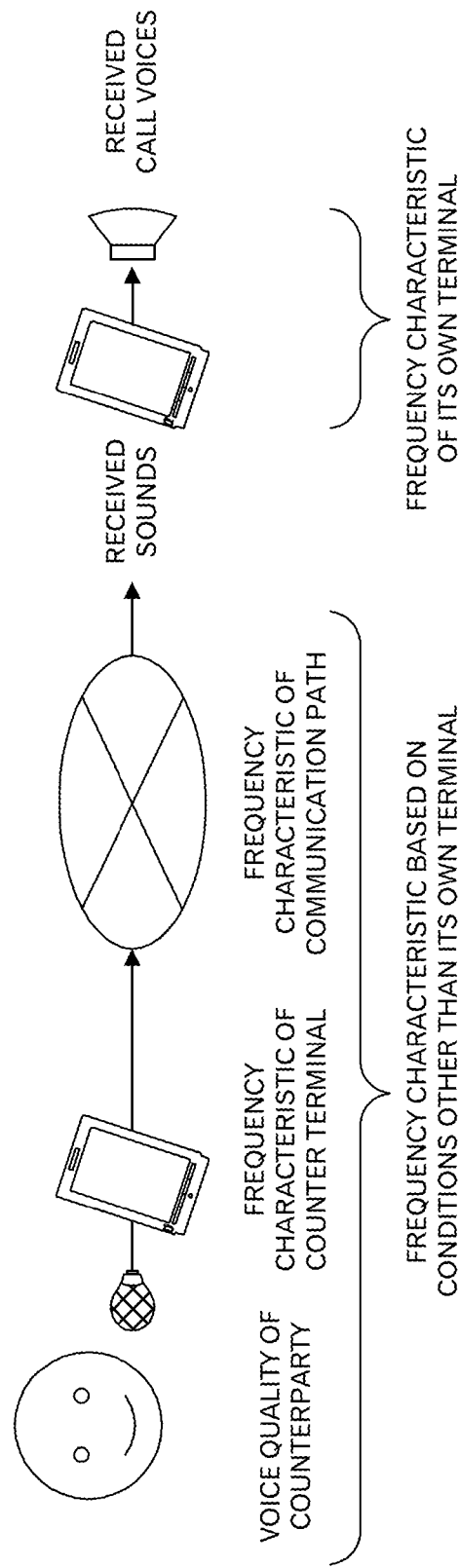
FIG. 1 is a diagram to explain the sound quality of received voices.

First, a sound quality of received call voices will be explained by using FIG. 1. Here, a phone call between two communication terminals is presumed. Especially, the sound quality that is determined by a frequency characteristic based on conditions other than its own terminal such as a voice quality of a counterparty on the phone call, a characteristic of the counter terminal and/or a frequency characteristic of a communication network is called the sound quality of received sounds. Then, the sound quality of the received call voices is influenced by the quality of the received sounds and a frequency characteristic of its own terminal.

Because the frequency characteristic of its own terminal is often steady, a predetermined effect can be maintained by performing adjustments in advance. On the other hand, because the sound quality of the received sounds varies each time, the effect cannot uniformly be obtained by predetermined adjustment.

Therefore, in order to dissolve the difficulty to hear reproduced voices, which is caused by the sound quality of the received sounds, it is requested to adjust the received sounds. This embodiment pays attention, especially, to a "feeling of muffled sounds", which represents the sound quality that the clearness of the sound lacks, and to "lightness", which represents the sound quality that the depth of the sound lacks. Both of the "feeling of muffled sounds" and the "lightness" are characteristics that are included in the received sounds.

Next, the "feeling of muffled sounds" and the "lightness" will be explained. First, the "feeling of muffled sounds" will be explained. The lack of the clearness occurs when a ratio of a sound volume in the high-range frequencies to a sound volume in the low-range frequencies is low.

Figure 2:
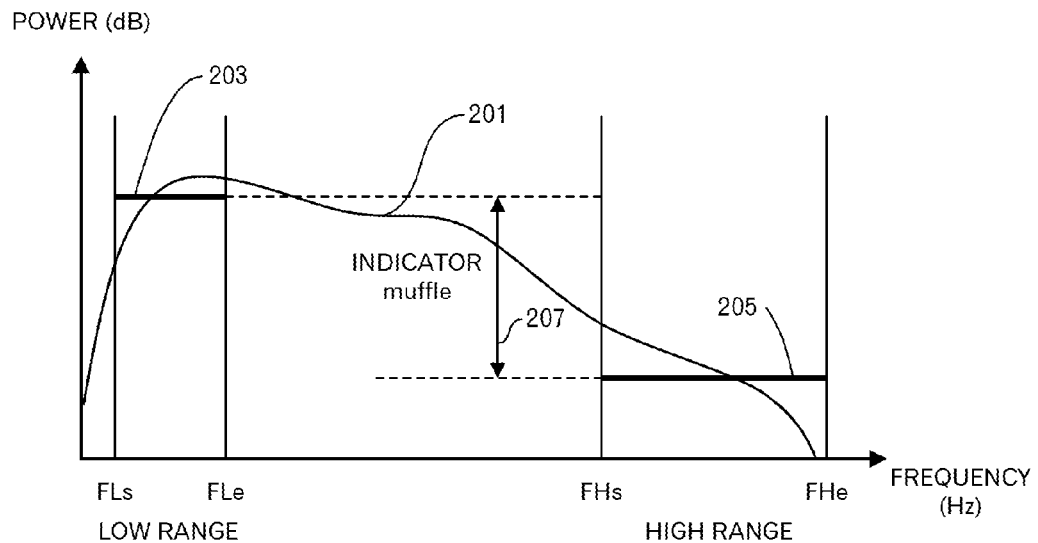
FIG. 2 is a diagram depicting an example of frequency characteristics of voices in case of a "feeling of muffled sounds" being caused.

FIG. 2 illustrates an example of a frequency characteristic of voices in case of the "feeling of muffled sounds" being caused. The vertical axis represents a power value (dB value) included in the sounds. The horizontal axis represents frequencies in a voice range. In this figure, FLs represents a frequency of a lower limit in the low-range frequencies, and FLe represents a frequency of an upper limit in the low-range frequencies. The low-range frequencies represent a bandwidth on the low-frequency side in the voice range. Moreover, FHs represents a frequency of a lower limit in the high-range frequencies, and FHe represents a frequency of an upper limit in the high-range frequencies. The high-range frequencies represent a bandwidth on the high-frequency side in the voice range. FLs, FLe, FHs and FHe are constants, respectively.

Curve 201 schematically represents powers included in the voice that cause the "feeling of muffled sounds". Straight line 203 represents an average of powers in the low-range frequencies. Straight line 205 represents an average of powers in the high-range frequencies.

A difference 207 between powers represents an indicator muffle representing a degree of the "feeling of muffled sounds". The indicator muffle is calculated by subtracting the average value (dB value) of powers in the high-range frequencies from the average value of powers in the low-range frequencies. When the indicator muffle exceeds a reference value (in this example, 30 dB) for determining the "feeling of muffled sounds", it is determined that the "feeling of muffled sounds" is caused. FIG. 2 illustrates a state that the indicator muffle exceeds the reference value.

Figure 3:
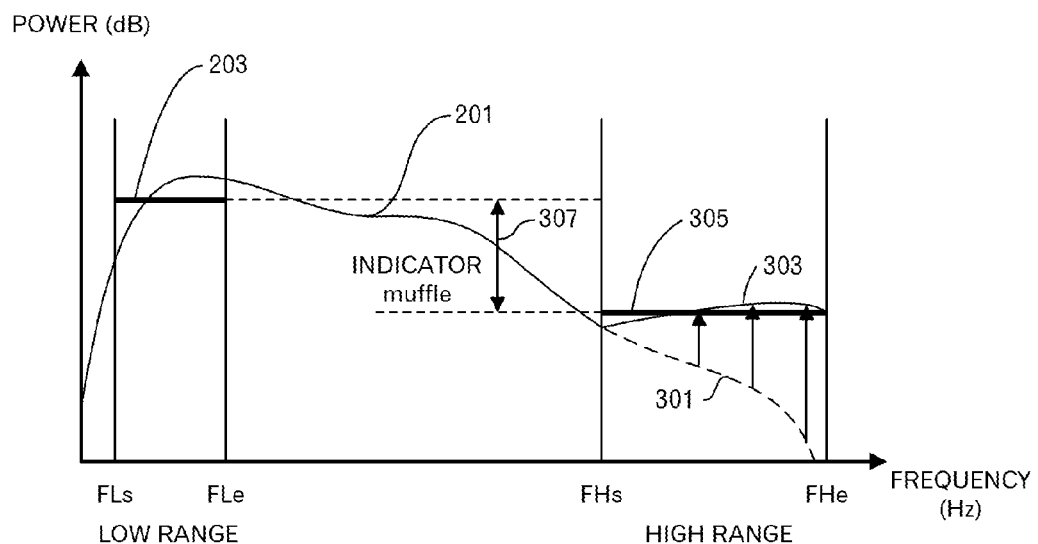
FIG. 3 is a diagram depicting an example of frequency characteristics of voices in case of the "feeling of muffled sounds" being dissolved.

Next, an outline of the adjustment to dissolve the "feeling of muffled sounds" will be explained. FIG. 3 illustrates an example of a frequency characteristic of voices in case where the "feeling of muffled sounds" is dissolved. In this example, the sounds in the high-range frequencies are emphasized by increasing the power in the high-range frequencies. The dashed line 301 represents original powers in the high-range frequencies. The solid line 303 represents modified powers. Thus, by emphasizing the sounds in the high-range frequencies, the "feeling of muffled sounds" can be dissolved.

The solid line 305 represents an average value of the adjusted powers in the high-range frequencies. Then, the indicator muffle after the adjustment is calculated by subtracting an average value (dB value) of the adjusted powers in the high-range frequencies from the average value (dB value) of the powers in the low-range frequencies. When the indicator muffle approaches the reference value, it means that the "feeling of muffled sounds" is improved. Moreover, when the indicator muffle reaches the reference value, it means that the "feeling of muffled sounds" is dissolved.

In this embodiment, it is determined whether or not the "feeling of muffled sounds" is caused, based on a balance between the high-range frequencies and the low-range frequencies, and powers in the high-range frequencies are adjusted so as to improve or dissolve the "feeling of muffled sounds".

Next, the "lightness" will be explained. The lack of the depth in the sounds occurs when a ratio of the sound volume in the midrange frequencies to the sound volumes in the low-range frequencies is high.

Figure 4:
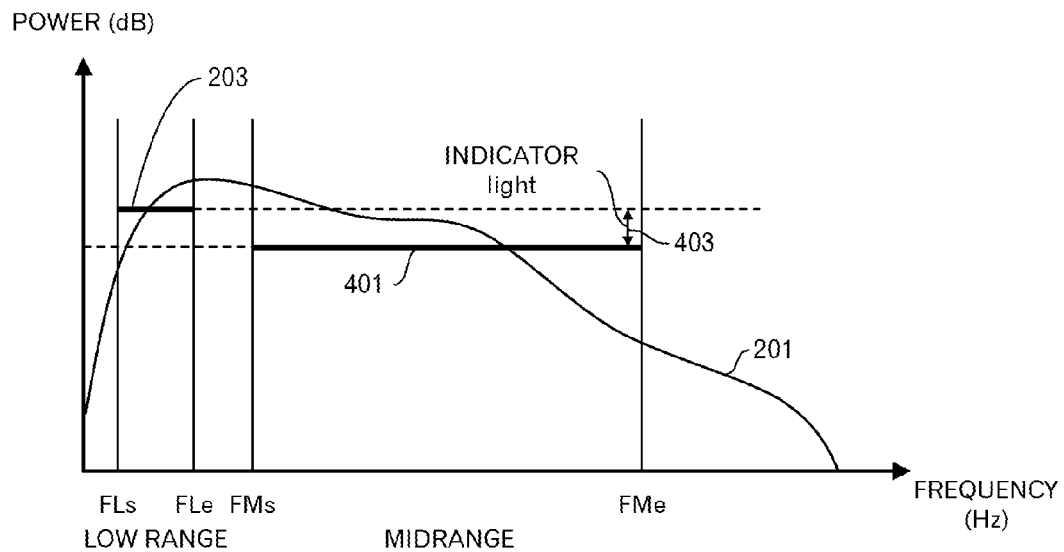
FIG. 4 is a diagram depicting an example of frequency characteristics of voices in case of "lightness" being caused.

FIG. 4 illustrates an example of the frequency characteristic of the voices in case where the "lightness" is caused. Similarly to FIG. 2, the vertical axis represents a value (dB value) of a power included in the voices, and the horizontal axis represents frequencies of the voice range. In addition, FLs and FLe are the same as those in FIG. 2.

FMs is a frequency that represents a lower limit of the midrange frequencies, and FMe is a frequency that represents an upper limit of the midrange frequencies. The midrange represents a bandwidth of frequencies near the center of the voice frequency range. It can be said that the midrange is a bandwidth between the low range and the high range. FMs and FMe are constants.

Curve 201 schematically represents powers included in the voice that causes the "lightness". Straight line 203 represents an average value of powers in the low-range frequencies. Straight line 401 represents an average value of powers in the midrange frequencies.

Difference 403 of powers represents an indicator light representing a degree of the "lightness". The indicator light is calculated by subtracting an average value (dB value) of powers in the midrange frequencies from an average value (dB value) of powers in the low-range frequencies. It is determined that the "lightness" is caused when the indicator light is less than a reference value (10 dB in this example) for determination for the "lightness". FIG. 4 represents a state where the indicator light is less than the reference value.

Figure 5:
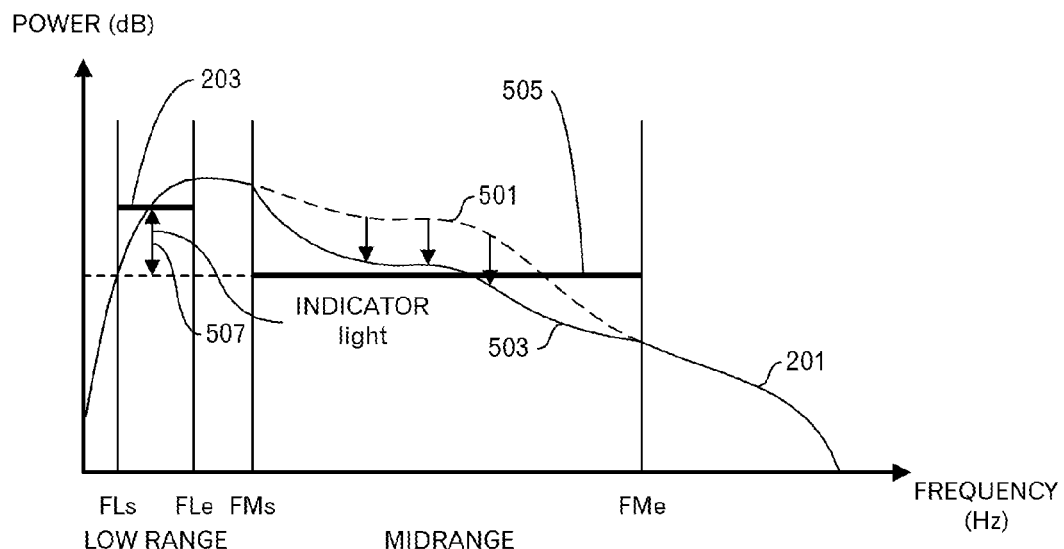
FIG. 5 is a diagram depicting an example of frequency characteristics of voices in case of the "lightness" being dissolved.

Next, an outline of the adjustment to dissolve the "lightness" will be explained. FIG. 5 illustrates an example of the frequency characteristic of voice when the "lightness" is dissolved. In this embodiment, by reducing the power in the midrange frequencies, the sounds in the midrange frequencies are suppressed. Dashed line 501 represents original powers in the midrange frequencies. Solid line 503 represents modified powers. Thus, the "lightness" is dissolved by suppressing the sounds in the midrange frequencies.

The straight line 505 represents an average value of adjusted powers in the midrange frequencies. Then, an indicator light after the adjustment is calculated by subtracting an average value (dB value) of adjusted powers in the midrange frequencies from an average value (dB value) of powers in the low-range frequencies. When the indicator light approaches the reference value, it means that the "lightness" is improved. Moreover, when the indicator light reaches the reference value, it means that the "lightness" is dissolved.

In this embodiment, it is determined based on the balance between the low range and the midrange of the frequencies whether or not the "lightness" is caused, and the powers in the midrange frequencies are adjusted so as to improve or dissolve the "lightness".

Figure 6:
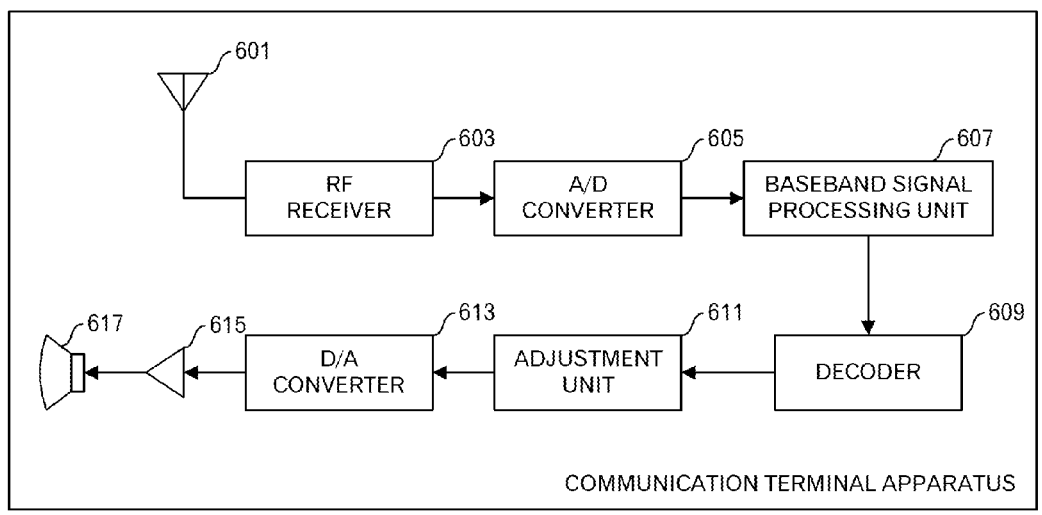
FIG. 6 is a diagram depicting a configuration example of a communication terminal apparatus.

In the following, a communication terminal apparatus that is an example of an apparatus for adjusting sound signals will be explained. FIG. 6 illustrates a configuration example of the communication terminal apparatus. The communication terminal apparatus has an antenna 601, a Radio Frequency (RF) receiver 603, an Analog/Digital (A/D) converter 605, a baseband signal processing unit 607, a decoder 609, an adjustment unit 611, a Digital/Analog (D/A) converter 613, an amplifier 615 and a speaker 617. The antenna 601 receives RF signals. The RF receiver 603 demodulates the RF signals received by the antenna 601. The A/D converter 605 converts analog signals to digital signals. The baseband signal processing unit 607 performs a baseband processing for the digital signals. The decoder 609 decodes the baseband signals to sound signals. The adjustment unit 611 performs adjustment for the sound signals. The D/A converter 613 converts the digital signals to analog signals. The amplifier 615 amplifies the analog signals. The speaker 617 outputs reproduced sounds.

Figure 7:
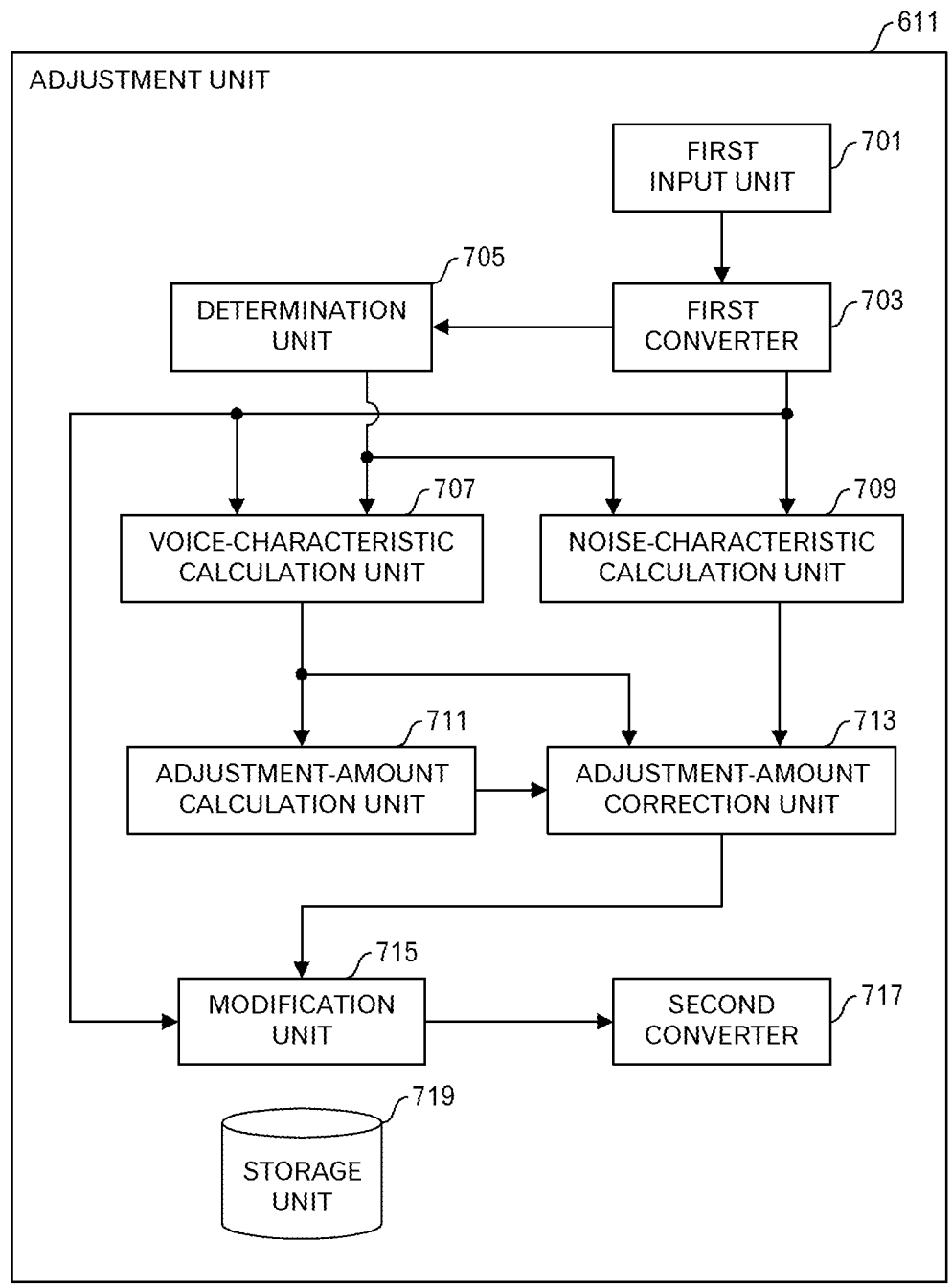
FIG. 7 is a diagram depicting a configuration example of an adjustment unit.

FIG. 7 illustrates a configuration example of the adjustment unit 611. The adjustment unit 611 has a first input unit 701, a first converter 703, a determination unit 705, a voice-characteristic calculation unit (A) 707, a noise-characteristic calculation unit 709, an adjustment-amount calculation unit 711, an adjustment-amount correction unit 713, a modification unit 715 and a second converter 717.

The first input unit 701 inputs signals of frames in sequence. The first converter 703 converts the signals of the frames to signals in a frequency domain from signals in a time domain. The determination unit 705 determines whether or not the signals of the frames represent voice sections. The voice-characteristic calculation unit (A) 707 calculates a frequency characteristic of voices. The noise-characteristic calculation unit 709 calculates a frequency characteristic of noises. The signals in the time domain is converted into the signals in the frequency domain. The adjustment-amount calculation unit 711 calculates an adjustment amount for the frequency characteristic of sound signals. The adjustment-amount correction unit 713 calculates a corrected adjustment amount. The modification unit 715 modifies the frequency characteristic of the sound signals based on the corrected adjustment amount. The second converter 717 converts the signals in the frequency domain to the signals in the time domain. The adjustment unit 611 may have a storage unit 719. The storage unit 719 may be used for storing each parameter. Each of processing units may store each parameter value in the storage unit 719, and may read each parameter value from the storage unit 719.

Figure 8:
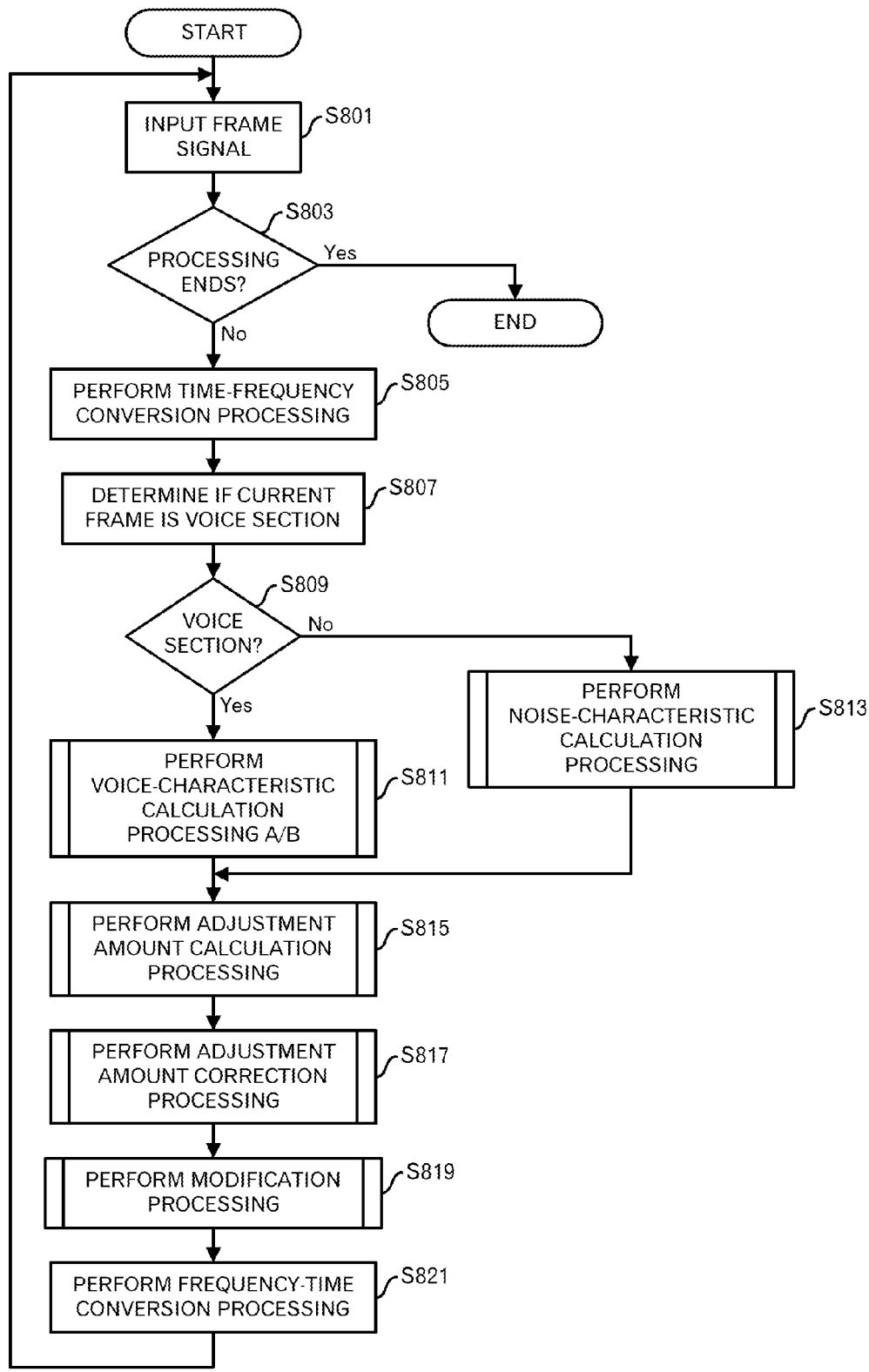
FIG. 8 is a diagram depicting a processing flow example of the adjustment unit.

FIG. 8 illustrates a processing flow example of the adjustment unit 611. The first input unit 701 inputs a signal of one frame (S801). More specifically, a signal that is decoded by the decoder 609 and has a predetermined length (e.g. 20 ms) is inputted. A signal of a frame to be processed hereinafter is a signal of a current frame. The first input unit 701 determines whether or not an input of the signal of the frames has been completed (S803). When the sound signal having the predetermined length cannot be obtained by the decoder 609, it is determined that the input of the sound signal has been completed.

When it is determined that the input of the sound signal has not been completed, the first converter 703 performs a time-frequency conversion processing (S805). In other words, the signal of the current frame is converted from the signal in the time domain to components in the frequency domain. For example, a processing for Fast Fourier Transformation (FFT) is carried out. Details of this FFT and Inverse Fast Fourier Transformation (IFFT) are well-known techniques, and further explanation is omitted here.

Next, the determination unit 705 determines whether the current frame is a voice section or non-voice section (S807). The voice section (which may be called voice-activity section) is a section that includes voices, and the non-voice section (which may be called non-voice-activity section) is a section that does not include voices. The non-voice section is a section that is comprised of noises other than voices. In this case, the voice means voice spoken by a human being. The determination unit 705 performs a processing of S807 based on frequency components of the current frame, for example. The detailed determination method is known, and described in Japanese Patent No. 4519169, for example. Therefore, further explanation is omitted.

When the current frame is the voice section (S809: Yes route), a long-term average value of the frequency characteristic of the voices is calculated. Therefore, the voice characteristic calculation unit 707 performs a voice-characteristic calculation processing A (S811). Incidentally, in a second embodiment that will be described later, a voice-characteristic calculation processing B is performed at S811.

Figure 9:
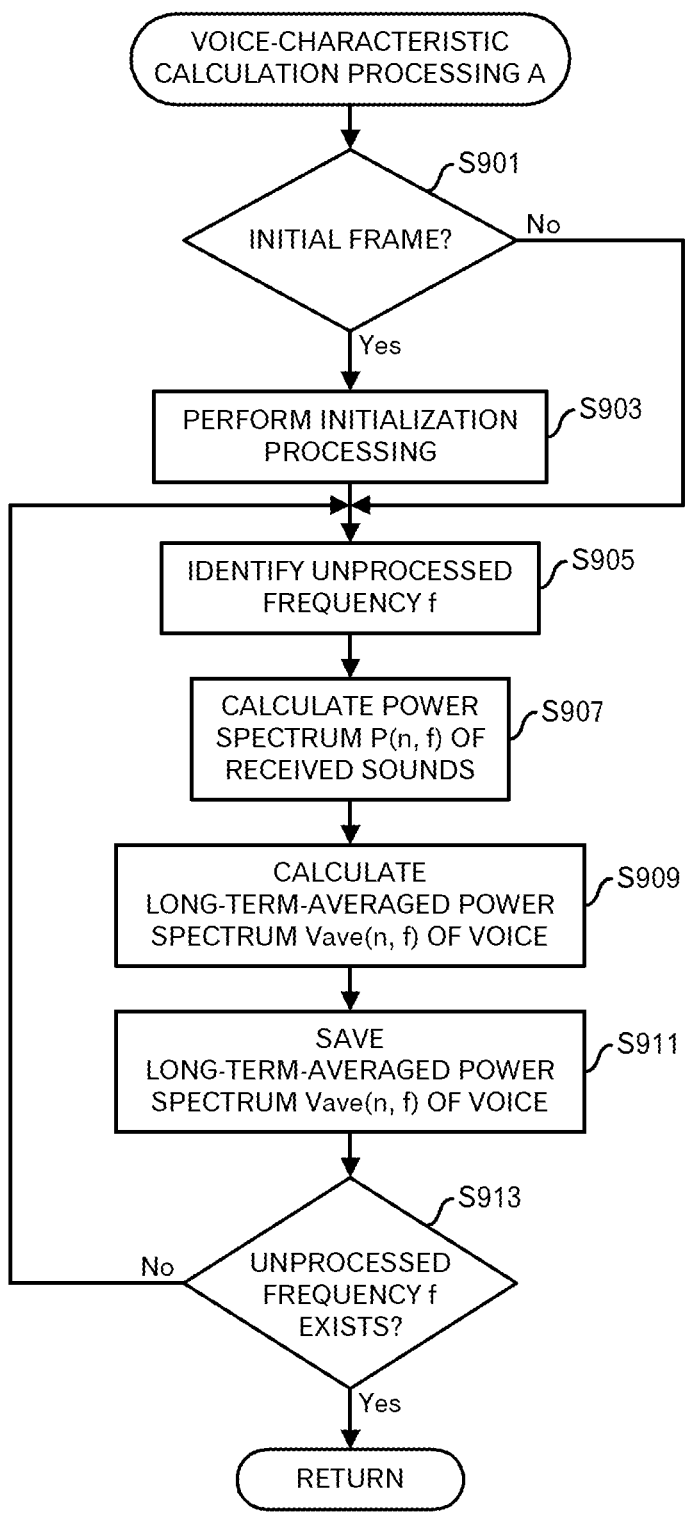
FIG. 9 is a diagram depicting a flow example of a voice characteristic calculation processing A.

FIG. 9 illustrates a flow example of the voice-characteristic calculation processing A. The voice-characteristic calculation unit 707 determines whether or not the current frame is a frame to be processed firstly (S901). A frame index is assigned to each frame. In this example, the frame index is represented by "n". When n is "1", it is determined that the current frame is the first frame. As for subsequent frames, n is incremented by "1" for each frame in order of inputs.

When it is determined that the current frame is the frame to be processed firstly, the voice-characteristic calculation unit 707 performs an initialization processing (S903). First, a value within a range from 0 to 1 is set as a contribution coefficient $\alpha$ that represents a contribution degree of the current frame to the long-term average. For example, 0.001 is set as $\alpha$. This means an average value of 1000 frames is calculated. The greater the value of the contribution coefficient $\alpha$ is, the greater the contribution degree of the signal of the current frame to the long-term average value is.

In the initialization processing, the voice-characteristic calculation unit 707 sets an initial value of a power spectrum Vave(n, f) to be calculated. Vave(n, f) is a power spectrum of the voice, which is averaged in the long term. More specifically, "0" is set as Vave(0, f). f is a frequency index. In this example, as for f, natural numbers from 0 to 127 are used. In other words, "0" is set to each of variables Vave(0, 0), Vave(0, 1), Vave(0, 2), . . . and Vave(0, 127).

After the initialization processing, the processing shifts to a processing of S905. When it is determined at the S901 that the current frame is not a frame to be processed firstly, the processing shifts to the processing of the S905 without performing the initialization processing.

The voice-characteristic calculation unit 707 identifies an unprocessed frequency f from among values 0 to 127 (S905). The voice-characteristic calculation unit 707 calculates a power spectrum P(n, f) of the received sound (S907). More specifically, the voice-characteristic calculation unit 707 calculates a power spectrum (i.e. a linear value) from a Fourier spectrum (real part P_re, imaginary part P_im) of the signal of the current frame. Both of the Fourier spectrum and power spectrum are examples of the frequency characteristics.

Next, the voice-characteristic calculation unit 707 calculates a long-term-averaged power spectrum Vave(n, f) of the voice, according to a following expression (S909). In the following, in order to identify that the current frame is the voice section, the power spectrum is called the long-term-averaged power spectrum of the voice. The long-term-averaged power spectrum of the voice is also a linear value. The long-term-averaged power spectrum of the voice is also an example of the frequency characteristics.

$$Vave(n,f) = \alpha \times P(n,f) + (1-\alpha) \times Vave(n-1,f)$$

When there is no Vave(n−1, f), a value of Vave(n−x, f), which is an existing value obtained by tracing back in sequence, may be used. "x" is a natural number greater than "1". This is because Vave(n−1, f) may not be calculated for the non-voice section.

The aforementioned long-term-averaged power spectrum of the voice is an example of a smoothed power spectrum of the voice. Moreover, the smoothed power spectrum of the voice may be calculated by other methods.

The voice-characteristic calculation unit 707 stores the long-term-averaged power spectrum Vave(n, f) of the voice in a memory such as a main memory (S911). Then, the voice-characteristic calculation unit 707 determines whether or not there is an unprocessed frequency f (S913). When there is an unprocessed frequency f, the processing returns to the S905. When there is no unprocessed frequency f, the processing returns to the calling-source processing in FIG. 8.

Returning to the explanation of FIG. 8, when the determination unit 705 determines at the S809 that the current frame is the non-voice section, the noise-characteristic calculation unit 709 performs a noise-characteristic calculation processing (S813). In this processing, the noise-characteristic calculation unit 709 calculates a long-term average value of the frequency characteristics of the noises.

Figure 10:
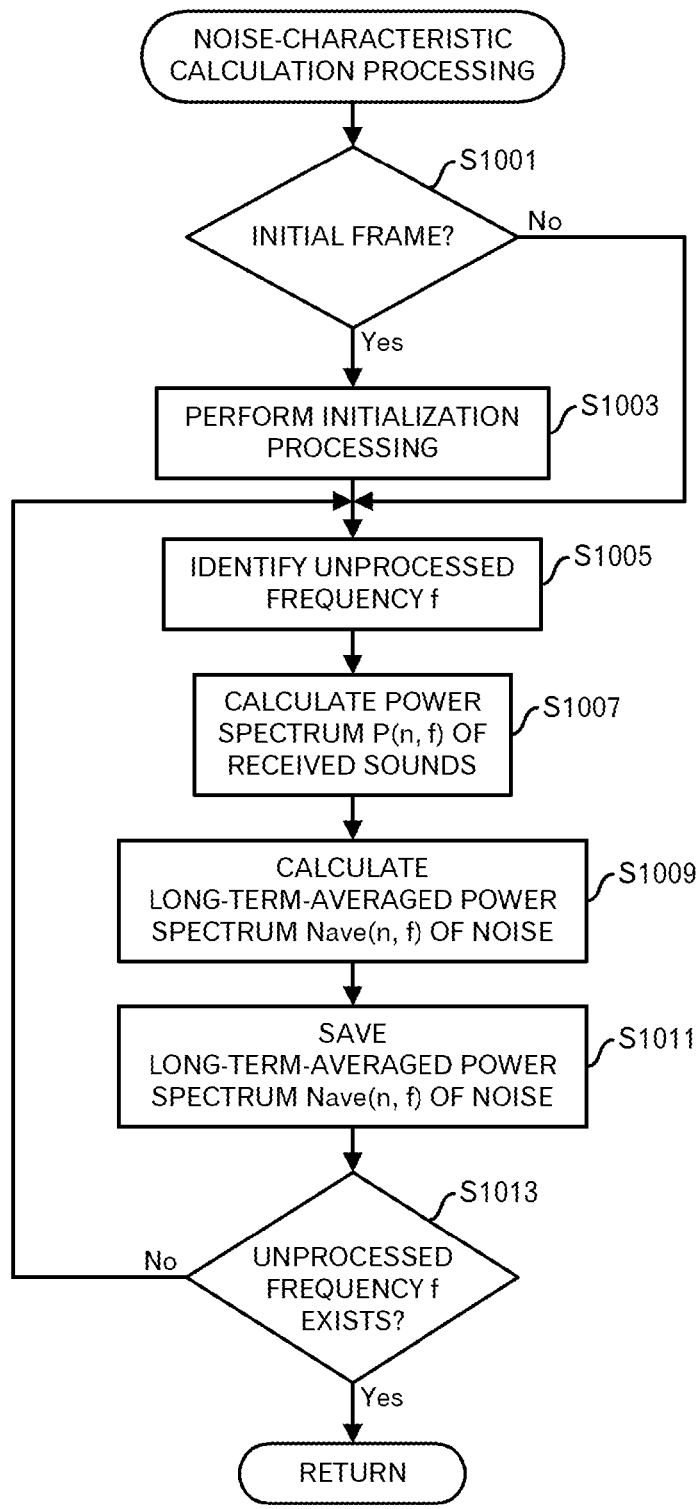
FIG. 10 is a diagram depicting a flow example of a noise characteristic calculation processing.

FIG. 10 illustrates a flow example of the noise-characteristic calculation processing. The noise-characteristic calculation unit 709 determines whether or not the signal of the current frame is a signal of a frame to be processed firstly (S1001). The determination method is similar to that in case of the voice-characteristic calculation unit 707.

When it is determined that the current frame is the frame to be processed firstly, the noise-characteristic calculation unit 709 performs an initialization processing (S1003). First, a value within a range from 0 to 1 is set to a contribution coefficient γ that represents a contribution degree of the current frame to the long-term average. For example, 0.001 is set to γ. The greater the value of the contribution coefficient γ is, the greater the contribution degree of the current frame signal to the long-term average is.

In the initialization processing, the noise-characteristic calculation unit 709 sets an initial value of a long-term-averaged power spectrum Nave(n, f) of the noise. More specifically, "0" is set to Nave(n, f). In other words, "0" is set to each of variables Nave(0, 0), Nave(0, 1), Nave(0, 2), . . . and Nave(0, 127).

After the initialization processing, the processing shifts to a processing of S1005. When it is determined at the S1001 that the current frame is not the frame to be processed firstly, the processing shifts to the processing of the S1005 without performing the initialization processing.

The noise-characteristic calculation unit 709 identifies an unprocessed frequency f from among the frequencies 0 to 127 (S1005). The noise-characteristic calculation unit 709 calculates a power spectrum P(n, f) of the received sound (S1007).

Next, the noise-characteristic calculation unit 709 calculates a long-term-averaged power spectrum Nave(n, f) of the noise according to the following expression (S1009). In the following, in order to identify the current frame is the non-voice section, the power spectrum is called the long-term-averaged power spectrum of the noise. The long-term-averaged power spectrum of the noise is a linear value. Moreover, the long-term-averaged power spectrum of the noise is used when calculating Signal to Noise ratio (SN ratio or SNR).

$$Nave(n,f) = \gamma \times P(n,f) + (1-\gamma) \times Nave(n-1,f)$$

When there is no Nave(n−1, f), N(n−x, f), which is a value obtained by tracing back in sequence, may be used. "x" is a natural value greater than "1".

The aforementioned long-term-averaged power spectrum of the noise is an example of the smoothed power spectrum of the noise. The smoothed long-term-averaged power spectrum of the noise may be calculated by other methods.

The noise-characteristic calculation unit 709 stores the long-term-averaged power spectrum of the noise in a memory such as the main memory (S1011). Then, the noise-characteristic calculation unit 709 determines whether or not there is no unprocessed frequency f (S1013). When there is an unprocessed frequency f, the processing returns to the S1005. When there is no unprocessed frequency f, the processing returns to the processing of FIG. 8.

Returning to the explanation of the processing of FIG. 8, the adjustment-amount calculation unit 711 performs an adjustment amount calculation processing (S815). The adjustment amount is a value to adjust the frequency characteristic of the voice signal. The adjustment amount is a dB value to be set for each frequency, for example.

Figure 11:
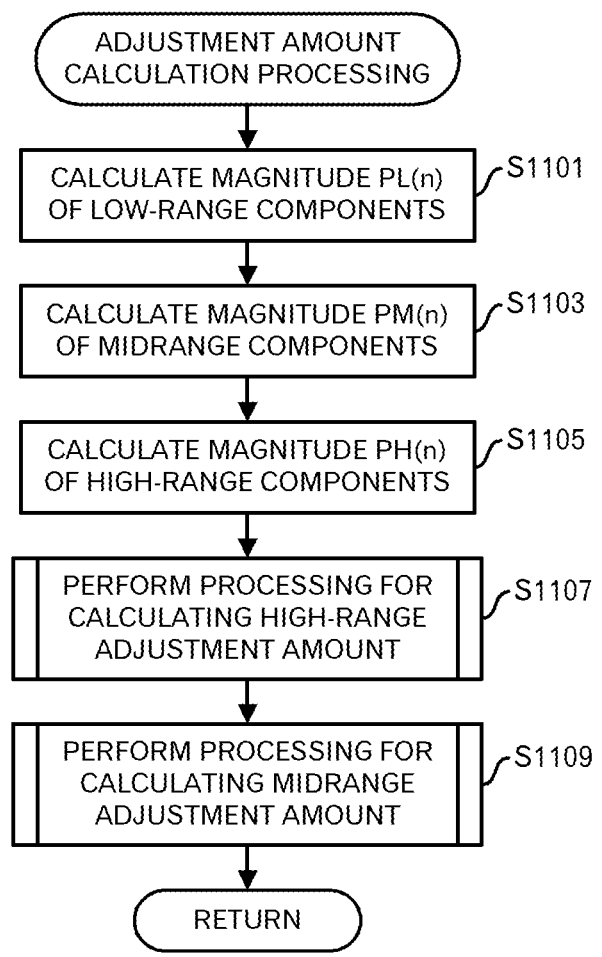
FIG. 11 is a diagram depicting a flow example of an adjustment amount calculation processing.

FIG. 11 illustrates a flow example of the adjustment amount calculation processing. In this example, a high-range adjustment amount is calculated based on the magnitudes of the low-range components in the long-term-averaged power spectrum of the voice and the magnitudes of the high-range components in the long-term-averaged power spectrum of the voice, and a midrange adjustment amount is calculated based on the magnitudes of the low-range components in the long-term-averaged power spectrum of the voice and the magnitudes of the midrange components in the long-term-averaged power spectrum of the voice.

Precedently, the magnitudes of the low-range components, the magnitudes of the midrange components and the magnitudes of the high-range components are calculated. The adjustment-amount calculation unit 711 calculates the magnitudes PL(n) of the low-range components with respect to the long-term-averaged power spectrum of the voice according to the following expression (S1101).

$$PL(n) = \frac{1}{FLe - FLs} \sum_{f=FLs}^{FLe} Vave(n, f)$$

The low range is a range from FLs=100 Hz to FLe=1000 Hz, for example.

Next, the adjustment-amount calculation unit 711 calculates the magnitudes PM(n) of the midrange components with respect to the long-term-averaged power spectrum of the voice according to the following expression (S1103).

$$PM(n) = \frac{1}{FMe - FMs} \sum_{f=FMs}^{FMe} Vave(n, f)$$

The midrange is a range from FMs=1000 Hz to FMe=3000 Hz, for example.

Furthermore, the adjustment-amount calculation unit 711 calculates the magnitudes PH(n) of the high-range components with respect to the long-term-averaged power spectrum of the voice according to the following expression (S1105).

$$PH(n) = \frac{1}{FHe - FHs} \sum_{f=FHs}^{FHe} Vave(n, f)$$

The high range is a range from FHs=3000 Hz to FHe=4000 Hz, for example.

In this example, as the magnitude of the components, an arithmetic mean is calculated. This is an example of a representative value of the power spectrums included in the range. Other mean such as a geometric mean or harmonic mean may be employed. Furthermore, other representative value such as a mode or median may be calculated.

Next, the adjustment-amount calculation unit 711 performs a processing for calculating a high-range adjustment amount (S1107). The adjustment-amount calculation unit 711 calculates a high-range adjustment amount GainH(n) according to the following expression.

$$\text{Gain}H(n) = \text{MAX}(0, 10 \log_{10}(PL(n)/PH(n)) - THA)$$

THA is a reference value regarding a ratio of the magnitude of the low-range components to the magnitude of the high-range components. In this example, THA is 30 dB. According to the aforementioned expression, when $10 \log_{10} (PL(n)/PH(n))$ is equal to or less than 30 dB, the high-range adjustment amount GainH(n) becomes 0 dB, and when $10 \log_{10} (PL(n)/PH(n))$ is greater than 30 dB, the high-range adjustment amount GainH(n) is a difference (which is a positive value) obtained by subtracting 30 from $10 \log_{10} (PL(n)/PH(n))$. $10 \log_{10} (PL(n)/PH(n))$ corresponds to the indicator muffle illustrated in FIG. 2.

Figure 12:
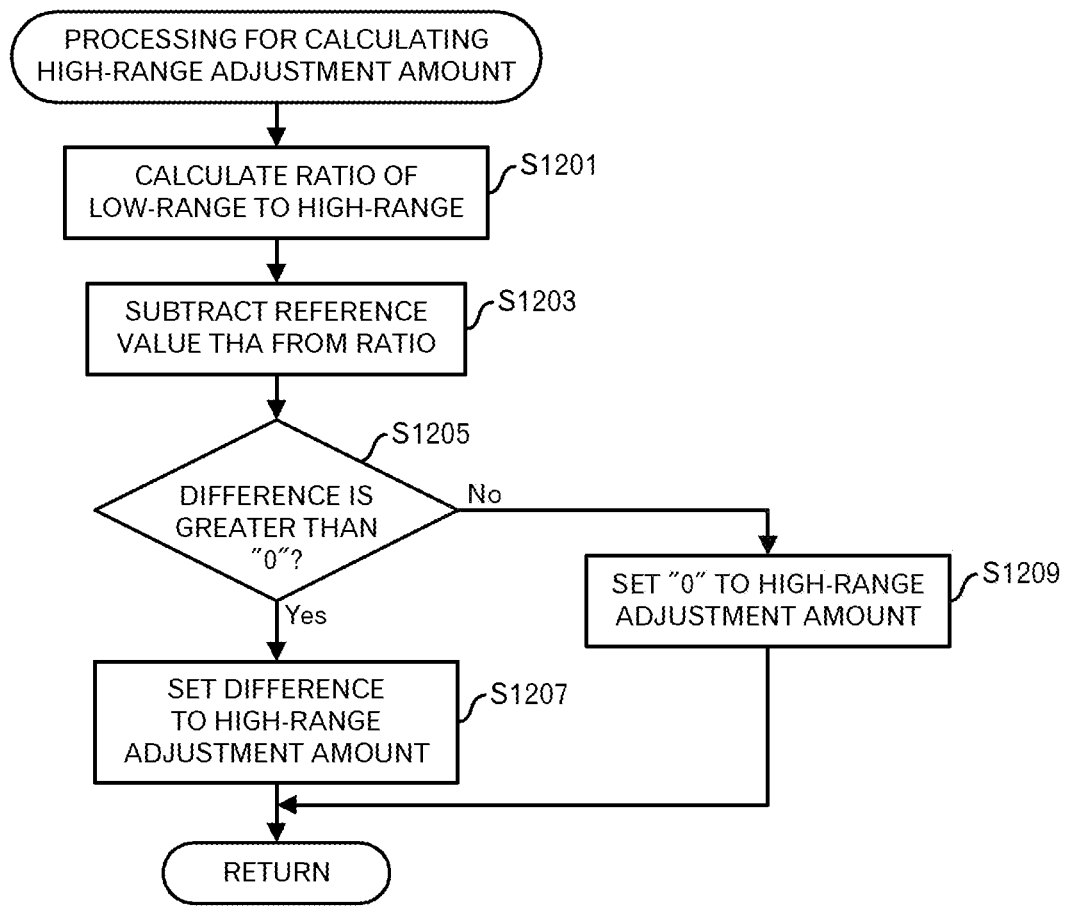
FIG. 12 is a diagram depicting a flow example of a processing for calculating an adjustment amount in high-range frequencies.

FIG. 12 illustrates a flow example of a processing for calculating a high-range adjustment amount. The adjustment-amount calculation unit 711 calculates a ratio of the magnitude of the low-range components to the magnitude of the high-range components (S1201). More specifically, the adjustment-amount calculation unit 711 converts the unit to a decibel unit by calculating $10 \log_{10} (PL(n)/PH(n))$. Then, the adjustment-amount calculation unit 711 subtracts a reference value THA from the ratio (S1203). The adjustment-amount calculation unit 711 determines whether or not the difference is greater than "0" (S1205). When it is determined that the difference is greater than "0", the adjustment-amount calculation unit 711 sets the difference to the high-range adjustment amount GainH(n) (S1207). The sounds in the high range are emphasized by this high-range adjustment amount GainH (n). When it is determined that the difference is not greater than "0", the adjustment-amount calculation unit 711 sets "0" to the high-range adjustment amount GainH(n) (S1209). In this case, the sounds in the high range are not emphasized.

The processing returns to the processing in FIG. 11. Next, the adjustment-amount calculation unit 711 performs a processing for calculating a midrange adjustment amount processing (S1109). The adjustment-amount calculation unit 711 calculates a midrange adjustment amount GainM(n) according to the following expression.

$$\text{Gain}M(n) = \text{MIN}(0, THB - 10 \log_{10}(PM(n)/PL(n)))$$

THB is a reference value with respect to a ratio of the magnitude of the midrange components to the magnitude of the low-range components. In this example, THB is 10 dB. According to the aforementioned expression, when $10 \log_{10} (PM(n)/PL(n))$ is equal to or less than 10 dB, the midrange adjustment amount GainM(n) is 0 dB, and when $10 \log_{10} (PM(n)/PL(n))$ is greater than 10 dB, the midrange adjustment amount GainM(n) is a value (which is a negative value) obtained by subtracting $10 \log_{10} (PM(n)/PL(n))$ from 10.

Figure 13:
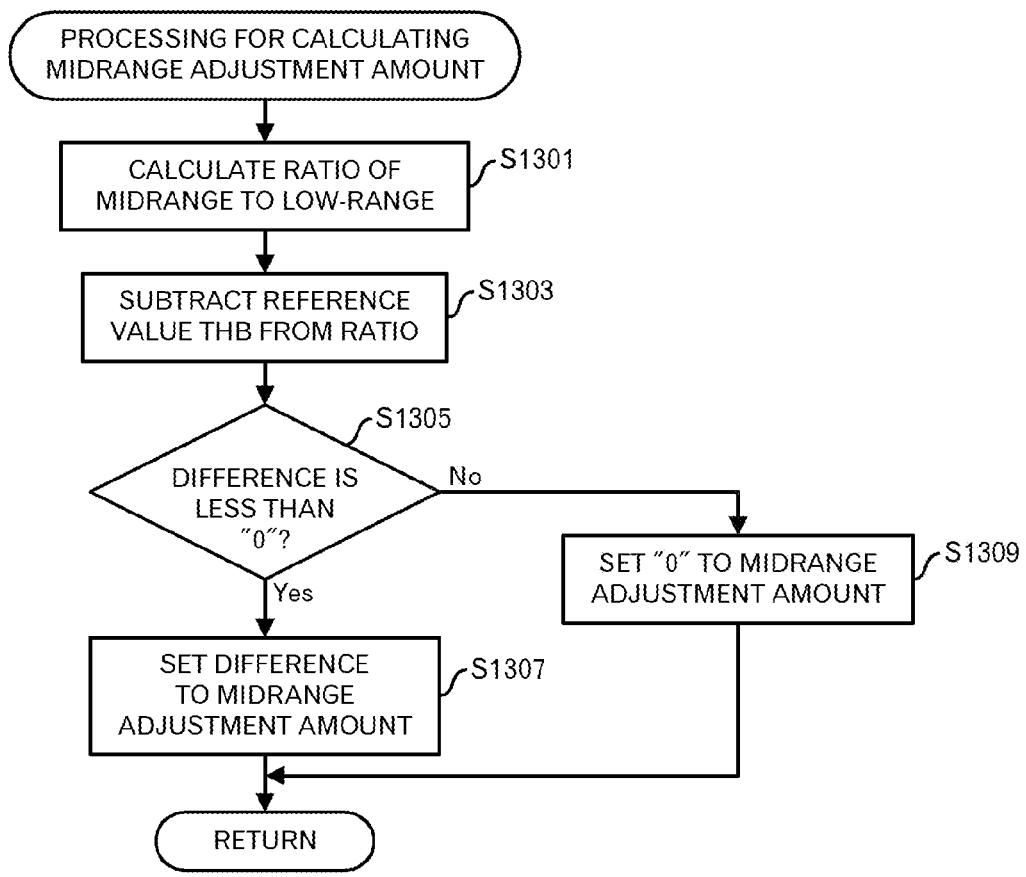
FIG. 13 is a diagram depicting a flow example of a processing for calculating an adjustment amount in midrange frequencies.

FIG. 13 illustrates a flow example of the processing for calculating a midrange adjustment amount. The adjustment-amount calculation unit 711 calculates a ratio of the magnitude of the midrange components to the magnitude of the low-range components (S1301). More specifically, the adjustment-amount calculation unit 711 converts the unit to a decibel unit by calculating $10 \log_{10} (PM(n)/PL(n))$. The adjustment-amount calculation unit 711 subtracts the ratio from the reference value THB (S1303). The adjustment-amount calculation unit 711 determines whether or not the difference is less than "0" (S1305). When it is determined that the difference is less than "0", the adjustment-amount calculation unit 711 sets the difference to the midrange adjustment amount GainM(n) (S1307). The sounds in the midrange is suppressed by this midrange adjustment amount GainM(n). When it is determined that the difference is not less than "0", the adjustment-amount calculation unit 711 sets "0" to the midrange adjustment amount GainM(n) (S1309). In this case, the sounds in the midrange are not emphasized.

Returning to the processing in FIG. 11, the adjustment amount calculation processing executed by the adjustment-amount calculation unit 711 ends, and the processing returns to the processing in FIG. 8.

Returning to the processing of FIG. 8, the adjustment-amount correction unit 713 performs an adjustment amount correction processing (S817). In the adjustment amount correction processing, the adjustment amount is corrected. In this example, a contribution coefficient by SNR and a contribution coefficient by the magnitude of the voice components are calculated, and a total contribution coefficient is calculated by multiplying the contribution coefficient by SNR and the contribution coefficient by the magnitude of the voice components. Furthermore, the adjustment amount for the midrange and the adjustment amount for the high range are calculated based on the total contribution coefficient.

Figure 14:
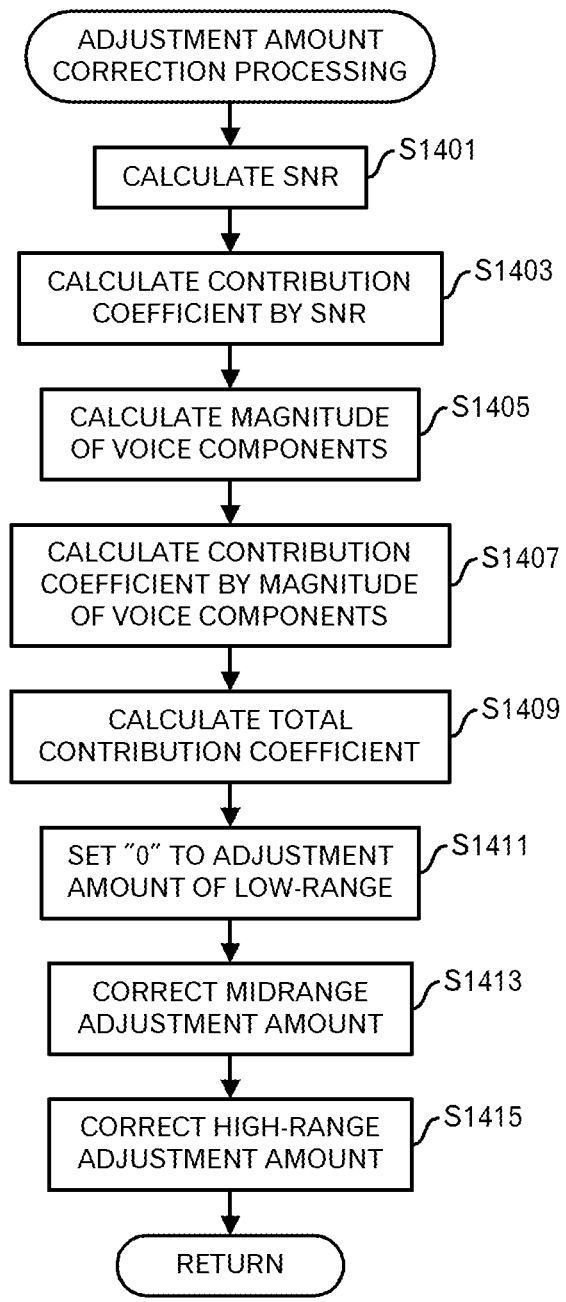
FIG. 14 is a diagram depicting a flow example of an adjustment correction processing.

FIG. 14 illustrates a flow example of the adjustment amount correction processing. The adjustment-amount correction unit 713 calculates SNR(n) according to the following expression (S1401). SNR(n) is a dB value.

$$SNR(n) = 10 \log_{10} \left( \frac{\sum_{f=0}^{127} Vave(n, f)}{\sum_{f=0}^{127} Nave(n, f)} \right)$$

Moreover, the adjustment-amount correction unit 713 calculates a contribution coefficient Coef_SNR(n) by SNR according to the following expression (S1403).

$$\text{Coef\_SNR}(n) = \frac{\text{SNR}(n) - \text{SNR\_L}}{\text{SNR\_H} - \text{SNR\_L}}$$

Figure 15:
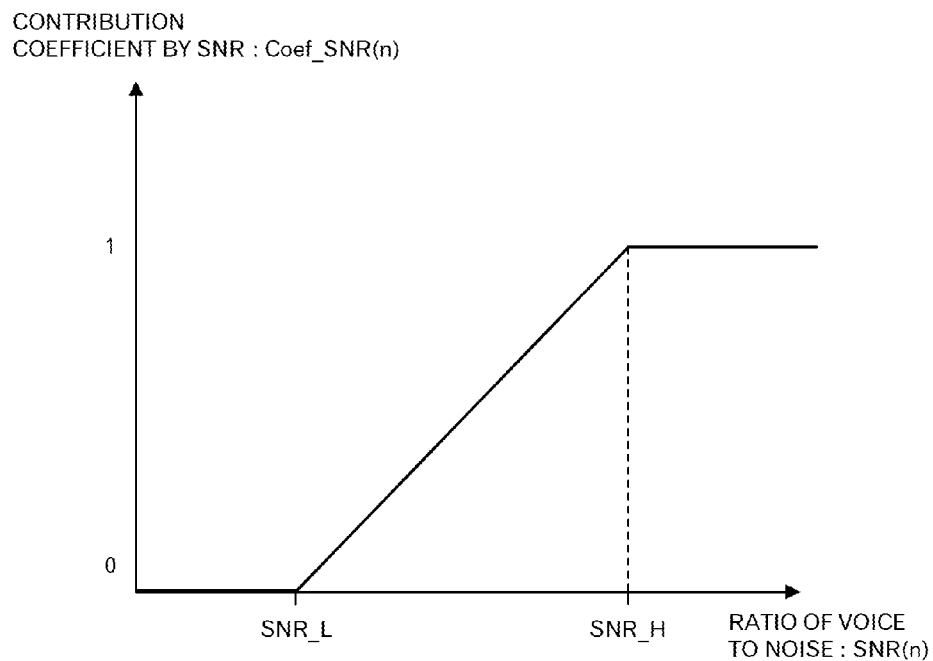
FIG. 15 is a diagram depicting a contribution coefficient by Sound-to-Noise Ratio (SNR)

SNR_L is a constant that represents a maximum value at which the contribution coefficient by SNR becomes "0". SNR_H is a constant that represents a minimum value at which the contribution coefficient by SNR becomes "1". According to the aforementioned expression, the contribution coefficient Coef_SNR(n) by SNR is a value illustrated in FIG. 15.

Returning to FIG. 14, the adjustment-amount correction unit 713 calculates the magnitude of the voice components according to the following expression (S1405).

$$V(n) = 10 \log_{10} \left( \sum_{f=0}^{127} 10^{\frac{Vave(n,f)}{10}} \right)$$

Moreover, the adjustment-amount correction unit 713 calculates a contribution coefficient Coef_V(n) by the magnitude of the voice components according to the following expression (S1407).

$$\text{Coef\_V}(n) = 1.0 - \frac{V(n) - V\_L}{V\_H - V\_L}$$

Figure 16:
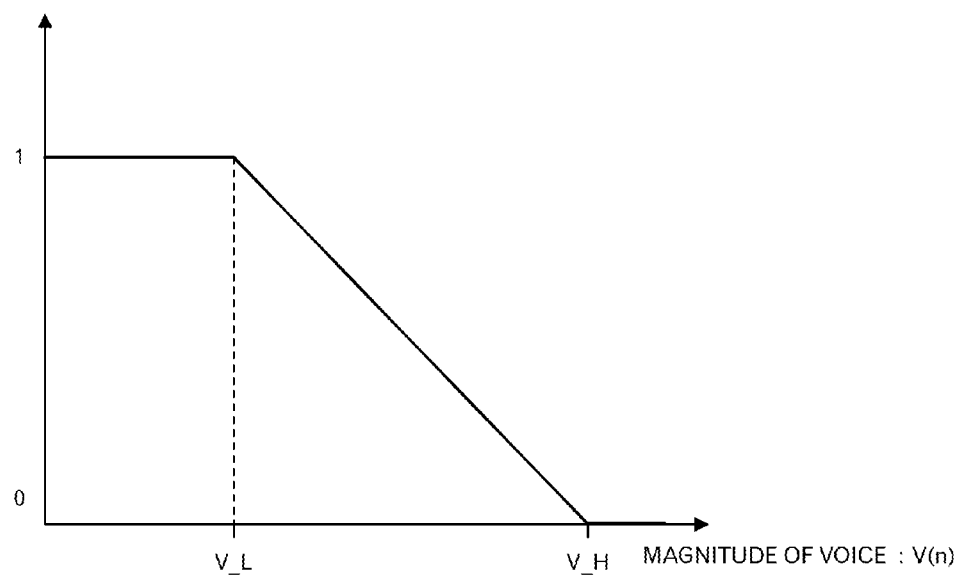
FIG. 16 is a diagram depicting a contribution coefficient depending on a magnitude of voice components.

V_L is a constant that represents a maximum value at which the contribution coefficient by the magnitude of the voice components becomes "1". V_H is a constant that represents a minimum value at which the contribution coefficient by the magnitude of the voice components becomes "0". According to the aforementioned expression, the contribution coefficient Coef_V(n) by the magnitude of the voice components becomes a value illustrated in FIG. 16.

Returning to the processing of FIG. 14, the adjustment-amount correction unit 713 calculates a total contribution coefficient β according to the following expression (S1409).

β(n)=Coef_V(n)×Coef_SNR(n)

The adjustment-amount correction unit 713 sets "0" to the adjustment amount Gain(n, f) in the low range (S1411) according to the following expression.

Gain(n,f)=0, if f<FLe

The adjustment-amount correction unit 713 sets a value obtained by correcting the midrange adjustment amount GainM(n, f) to the adjustment amount Gain(n, f) in the midrange according to the following expression (S1413).

Gain(n,f)=β×GainM(n), if FMs≤f≤FMe

The adjustment-amount correction unit 713 sets a value obtained by correcting the high-range adjustment amount GainH(n, f) to the adjustment amount Gain(n, f) in the high range according to the following expression (S1415).

Gain(n,f)=β×GainH(n), if FHs≤f≤FHe

Returning to the explanation of the processing in FIG. 8, the modification unit 715 performs a modification processing (S819). In the modification processing, the corrected adjustment amount is applied to the Fourier spectrum of the sound signals.

Figure 17:
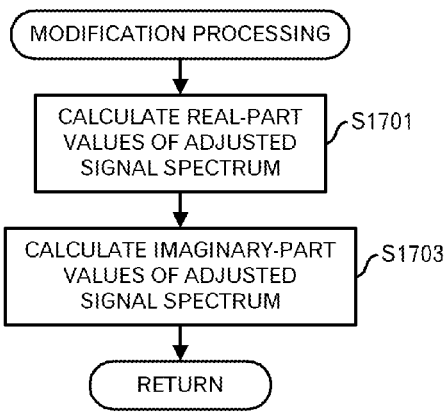
FIG. 17 is a diagram depicting a flow example of a modification processing.

FIG. 17 illustrates a flow example of the modification processing. The modification unit 715 calculates a value of Pout_re(n, f), which is a real part of the Fourier spectrum of the adjusted sound signals for each frequency (f: 0 to 127) according to the following expression (S1701).

$$\text{Pout\_re}(n, f) = \text{P\_re}(n, f) \times 10^{\frac{Gain(n,f)}{20}}$$

P_re(n, f) is a real part value of the Fourier spectrum of the input sound signal.

The modification unit 715 calculates a value of Pout_im(n, f) that is an imaginary part value of the Fourier spectrum of the adjusted sound signals for each frequency (f: 0 to 127) according to the following expression (S1703).

$$\text{Pout\_im}(n, f) = \text{P\_im}(n, f) \times 10^{\frac{Gain(n,f)}{20}}$$

P_im(n, f) is an imaginary part value of the Fourier spectrum of the input sound signals.

Returning to the explanation of the processing in FIG. 8, the second converter 717 performs a frequency-time conversion processing (S821). The adjusted sound signals are converted from the signals in the frequency domain to the signals in the time domain. This conversion is performed by IFFT, for example.

As described above, by modifying the frequency characteristic of the received sounds so as to satisfy the references for the "feeling of muffled sounds" and "lightness", it becomes possible to make it easy to hear the received sounds. For example, even if the "feeling of muffled sounds" and "lightness" occur due to the frequency characteristic based on the conditions other than its own terminal, it is possible to dissolve the difficulty in hearing the sounds.

Moreover, because the correction amount is calculated by using the long-term-averaged frequency characteristic of the voice, it is possible to avoid the influence from the fluctuation of the voice.

Moreover, because the adjustment amount is corrected depending on SNR of the received sounds, this embodiment is effective in case where SNR is greater and the deterioration of the voice quality does not occur easily by the adjustment. When SNR is lesser, the voice quality may be deteriorated by the adjustment.

In addition, because the adjustment amount is corrected by the magnitude of the voice included in the received sounds, the correction is performed in case where the voice is small.

Embodiment 2

In this embodiment, by using voice components that are not buried in surrounding noises (which is also called neighboring noise) near the communication terminal apparatus, the long-term-averaged frequency characteristic of the voice is calculated.

Figure 18:
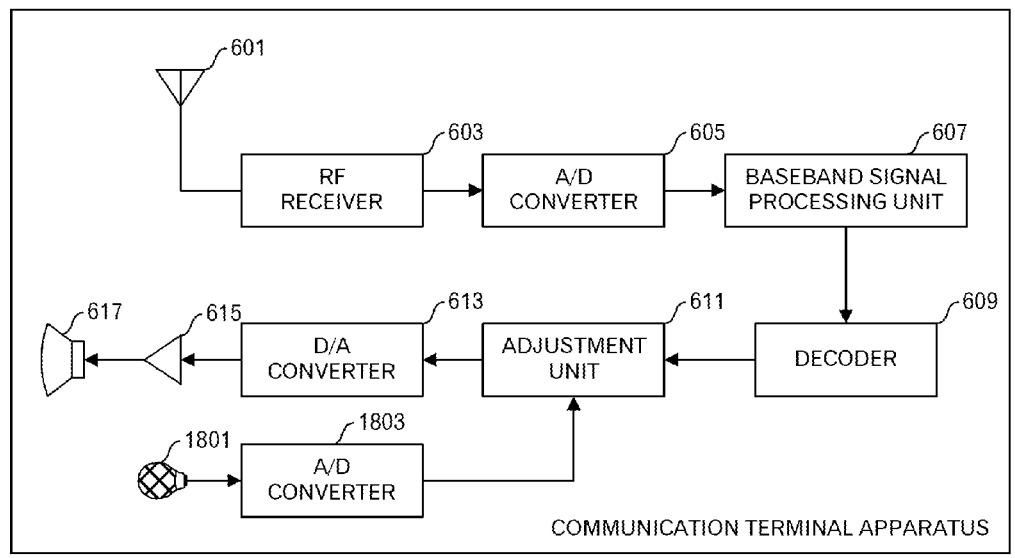
FIG. 18 is a diagram depicting a configuration example of a communication terminal apparatus relating to a second embodiment.

FIG. 18 illustrates a configuration example of a communication terminal apparatus relating to the second embodiment. The antenna 601, RF receiver 603, A/D converter 605, baseband signal processing unit 607, decoder 609, adjustment unit 611, D/A converter 613, amplifier 615 and speaker 617 are similar to those in FIG. 6. The communication terminal apparatus in the second embodiment further has a microphone 1801 and an A/D converter 1803. The microphone 1801 converts surrounding sounds to analog signals. The A/D converter 1803 converts the analog signals to digital signals.

Figure 19:
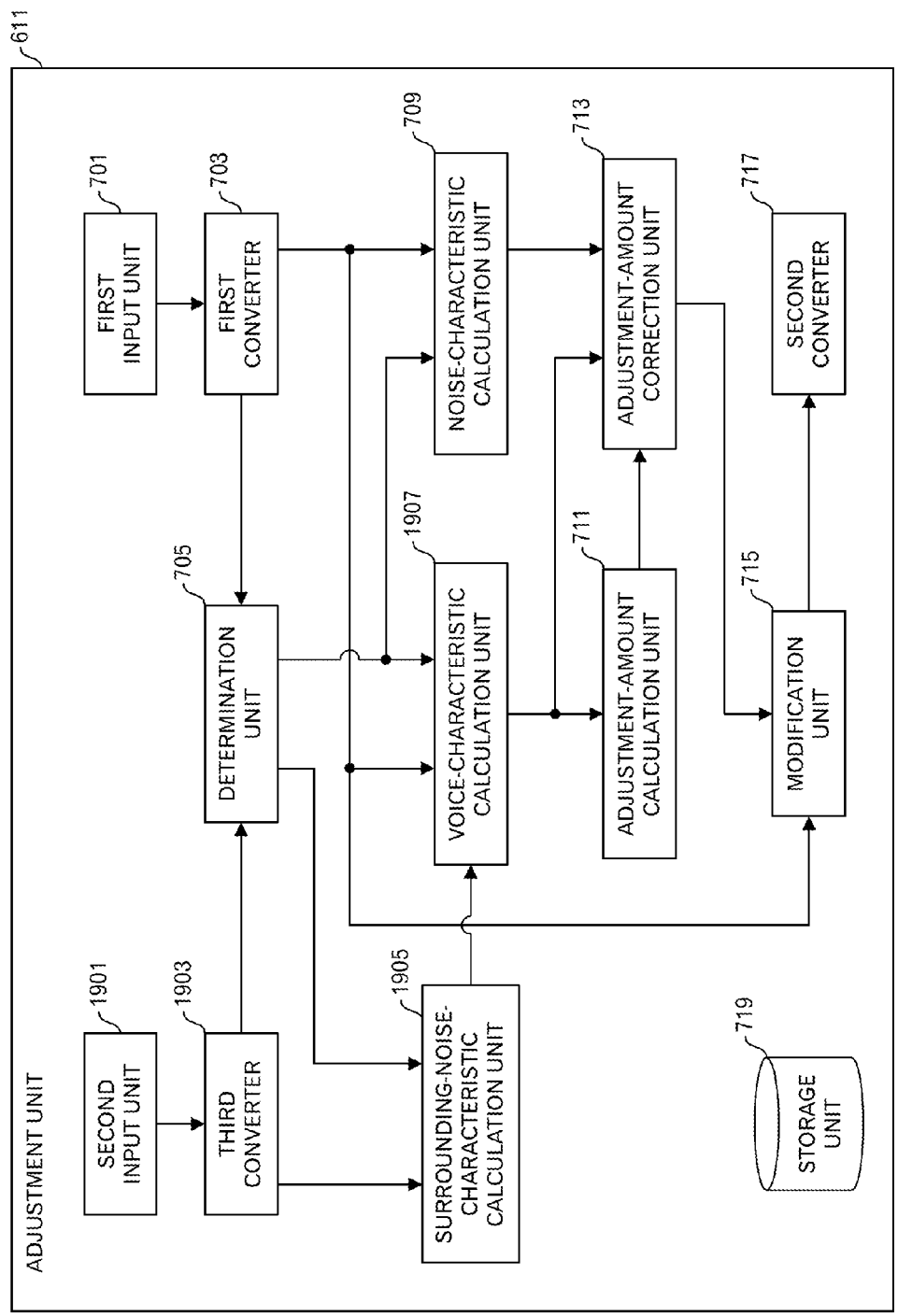
FIG. 19 is a diagram depicting a configuration example of an adjustment unit relating to the second embodiment.

FIG. 19 illustrates a configuration example of the adjustment unit 611 relating to the second embodiment. The first input unit 701, first converter 703, determination unit 705, noise characteristic calculation unit 709, adjustment-amount calculation unit 711, adjustment-amount correction unit 713, modification unit 715, second converter 717 and storage unit 719 are similar to those in FIG. 7. The adjustment unit 611 relating to the second embodiment further has a second input unit 1901, a third converter 1903 and surrounding-noise characteristic calculation unit 1905. Moreover, the adjustment unit 611 relating to the second embodiment has a voice-characteristic calculation unit 1907 instead of the voice-characteristic calculation unit 707.

The second input unit 1901 inputs signals of frames from sound signals inputted from the microphone 1801 in sequence. The third converter 1903 converts the signals of the frames from the microphone 1801 in the time domain to signals in the frequency domain. The surrounding-noise-characteristic calculation unit 1905 calculates a frequency characteristic concerning the surrounding noises. The voice-characteristic calculation unit 1907 calculates a frequency characteristic of the voices that are not buried in the noises.

Figure 20:
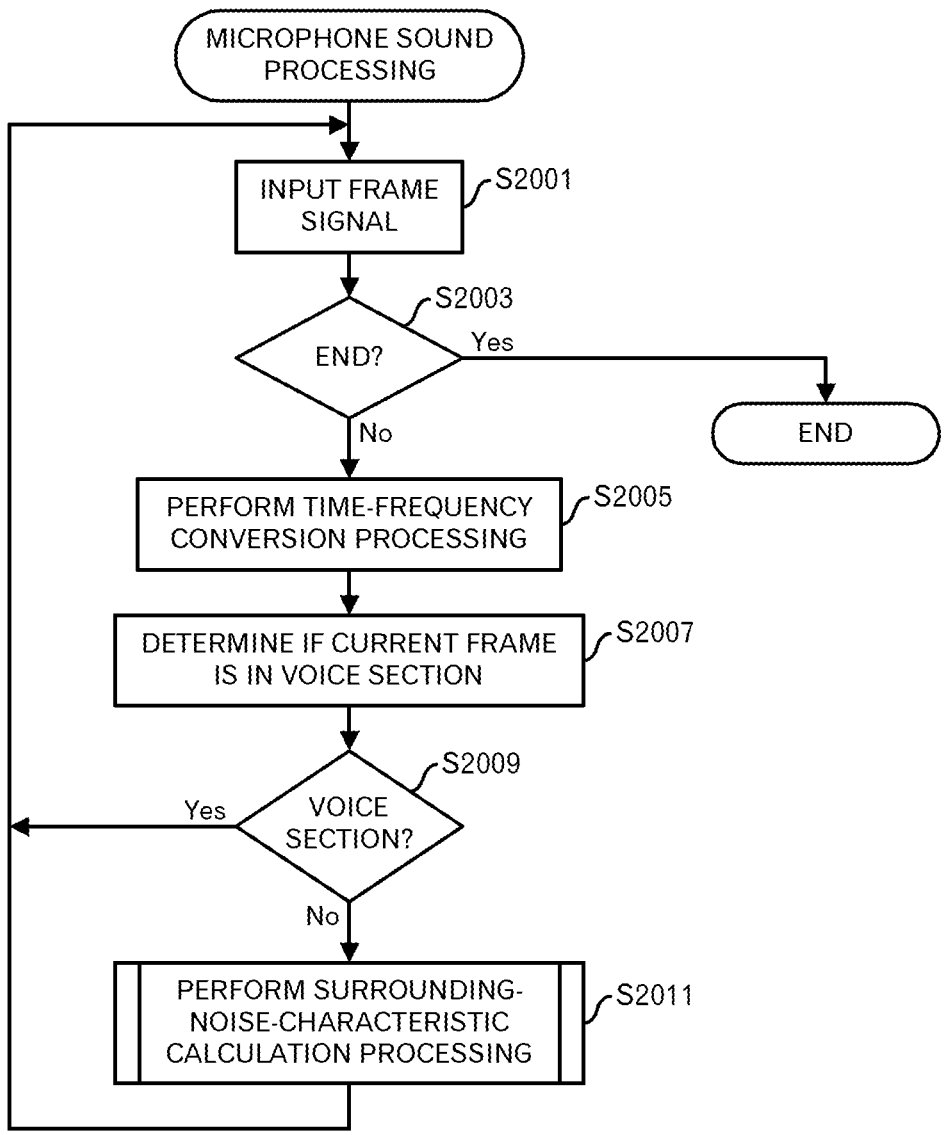
FIG. 20 is a diagram depicting a flow example of a microphone sound processing.

FIG. 20 illustrates a flow example of a microphone sound processing. The microphone sound processing is a processing for the sound signals inputted from the microphone 1801. First, the second input unit 1901 inputs sound signals in sequence (S2001). More specifically, a signal with a predetermined length (e.g. 20 ms) obtained from the A/D converter 1803 is inputted. The second input unit 1901 determines whether or not the processing ends (S2003). For example, when it is determined at the S803 in FIG. 8 that the input of the sound signals by the first input unit 701 ended, it is also determined at the S2003 that the processing ends. When it is not determined that the processing ends, the third converter 1903 performs a time-frequency conversion processing (S2005). More specifically, the inputted signals of the frames are converted from the signals in time domain to components in the frequency domain. For example, the FFT is carried out.

The determination unit 705 determines whether the input frame is in the voice section or non-voice section (S2007). This determination is similar to the determination method in the S807 in FIG. 8.

When it is determined that the input frame is in the voice section, the processing returns to the processing of the S2001, and the signal of the next frame is inputted.

When it is determined that the input frame is in the non-voice section, the surrounding-noise-characteristic calculation unit 1905 performs a surrounding-noise-characteristic calculation processing (S2011).

Figure 21:
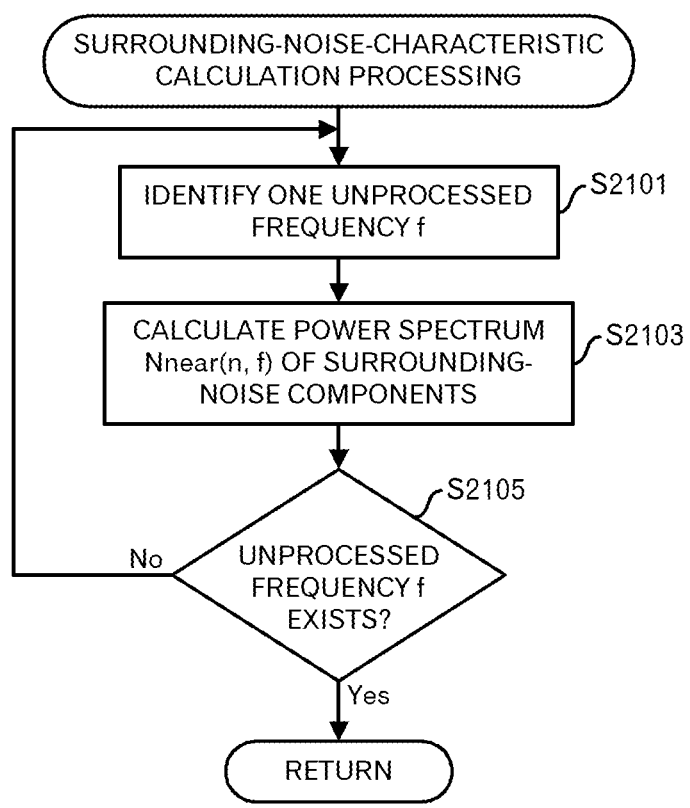
FIG. 21 is a diagram depicting a flow example of a surrounding noise characteristic calculation processing.

FIG. 21 illustrates a flow example of the surrounding-noise-characteristic calculation processing. The surrounding-noise-characteristic calculation unit 1905 identifies an unprocessed frequency f (S2101). The surrounding-noise-characteristic calculation unit 1905 calculates a power spectrum Nnear (n, f) of surrounding-noise components for the microphone inputs (S2103). Specifically, the surrounding-noise-characteristic calculation unit 1905 calculates a power spectrum (linear value) from the Fourier spectrum of the signals of the input frames. The surrounding-noise-characteristic calculation unit 1905 determines whether or not there is an unprocessed frequency f (S2105). When it is determined that there is an unprocessed frequency f, the processing returns to the processing of S2101. When it is determined that there is no unprocessed frequency f, the processing ends.

In the second embodiment, at the S811 in FIG. 8, a voice-characteristic calculation processing B is performed instead of the voice-characteristic calculation processing A.

Figure 22:
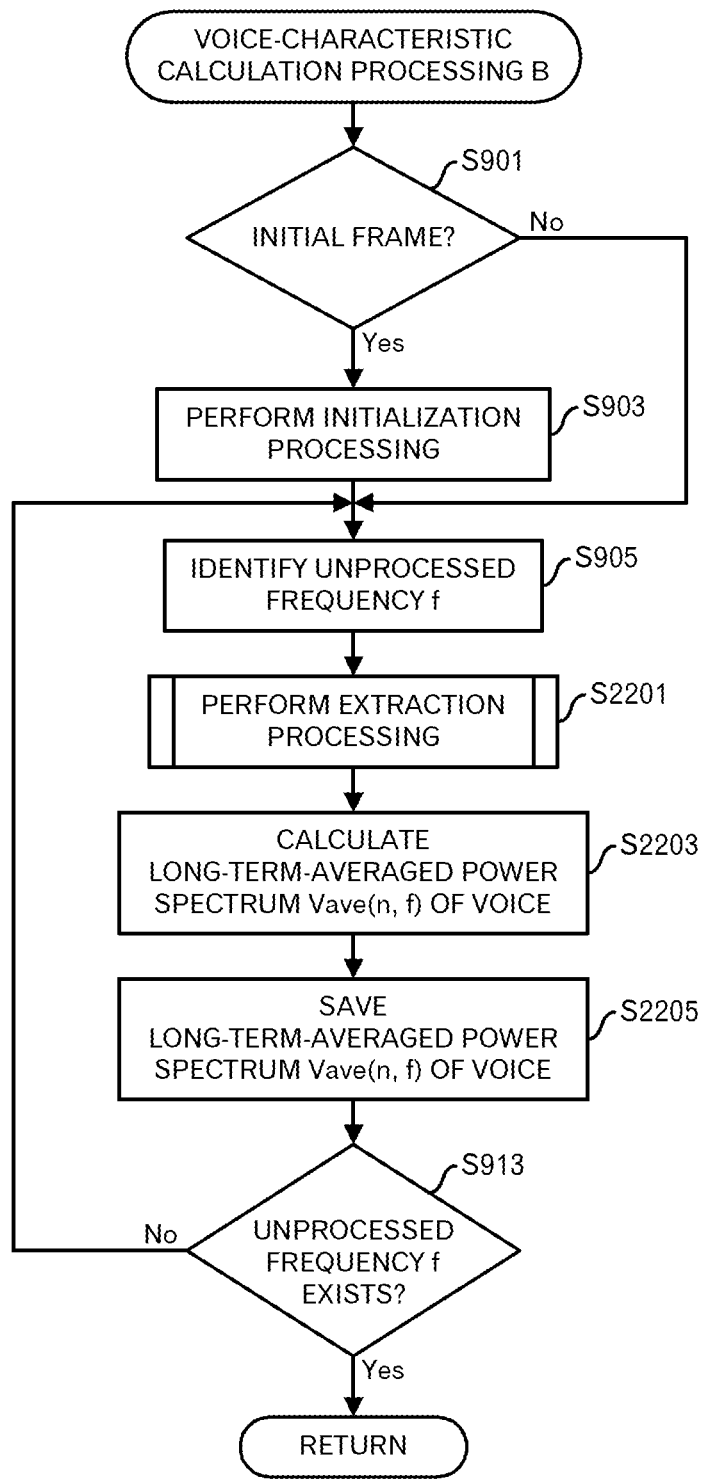
FIG. 22 is a diagram depicting a flow example of a voice characteristic calculation processing B.

FIG. 22 illustrates a flow example of the voice-characteristic calculation processing B. The processing of the S901 to S905 and S913 is similar to the processing in case of the voice-characteristic calculation processing A illustrated in FIG. 9.

After the processing of the S905, the voice-characteristic calculation unit 1907 performs an extraction processing (S2201).

Figure 23:
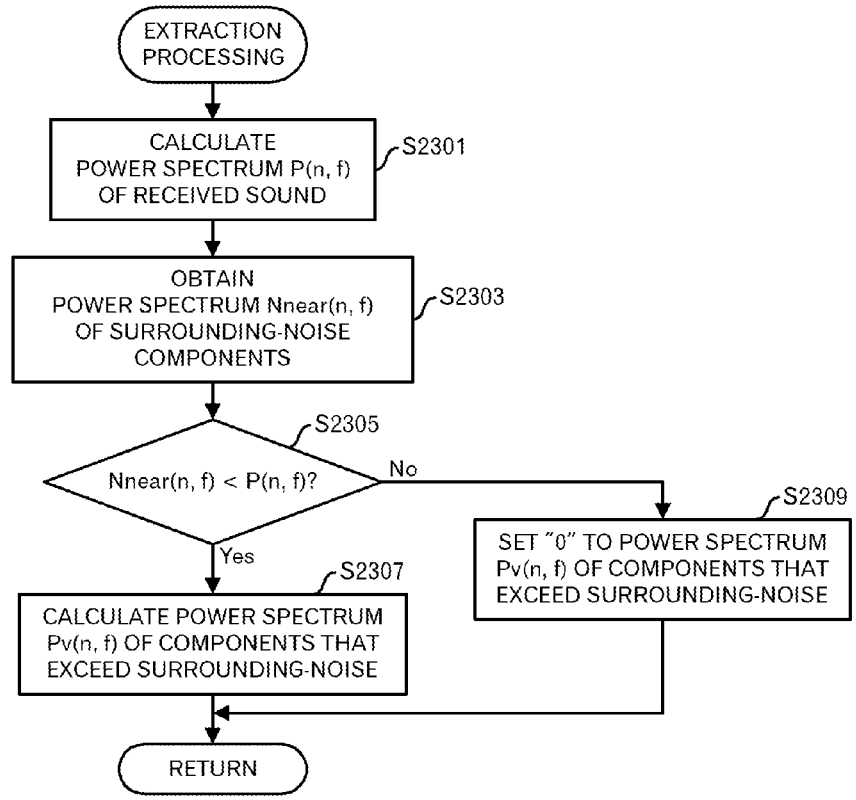
FIG. 23 is a diagram depicting a flow example of an extraction processing.

FIG. 23 illustrates a flow example of the extraction processing. In the extraction processing, the power spectrum Pv (n, f) of components that exceed the surrounding noises is calculated according to following two expressions. The power spectrum Pv (n, f) of the components that exceed the surrounding noises represents components (linear values) that are not buried in the surrounding noises among the power spectrum of the voice for the current frame.

$$Pv(n, f) = P(n, f) \times \left(1 - \frac{Nnear(n, f)}{P(n, f)}\right) \text{ if } Nnear(n, f) < P(n, f) \qquad (1)$$

$$Pv(n, f) = 0 \text{ if } Nnear(n, f) \geq P(n, f) \qquad (2)$$

The voice-characteristic calculation unit 1907 calculates a power spectrum P(n, f) of the received sounds (S2301). This processing is similar to that in case of the S907 in FIG. 9.

The voice-characteristic calculation unit 1907 obtains the power spectrum Nnear(n, f) for the surrounding noise components from the surrounding-noise-characteristic calculation unit 1905 (S2303). The voice-characteristic calculation unit 1097 determines whether or not the power spectrum of the received sounds is greater than the power spectrum for the surrounding noise components (S2305). When it is determined that the power spectrum for the surrounding noise components is greater than the power spectrum of the received sounds, the voice-characteristic calculation unit 1097 calculates the power spectrum Pv(n, f) for the components that exceed the surrounding noises according to the expression (1) (S2307). The power spectrum Pv(n, f) for the components that exceed the surrounding noises is a value obtained by subtracting the power spectrum Nnear(N, f) for the surrounding noise components from the power spectrum P(n, f) of the received sounds. This value is used for calculation of the long-term-averaged power spectrum of the voice. On the other hand, when it is determined that the power spectrum of the received sounds is not greater than the power spectrum for the surrounding noise components, the voice-characteristic calculation unit 1907 sets "0" to the power spectrum Pv(n, f) for the components that exceed the surrounding noises according to the expression (2) (S2309).

Returning to the processing in FIG. 22, the voice-characteristic calculation unit 1907 calculates a long-term-averaged power spectrum Vave(n, f) of the voice according to a following expression (S2203).

$$Vave(n,f) = \alpha \times Pv(n,f) + (1-\alpha) \times Vave(n-1,f)$$

Then, the voice-characteristic calculation unit 1907 holds the long-term-averaged power spectrum Vave(n, f) of the voice in a memory such as a main memory (S2205).

The subsequent processing, which uses the long-term-averaged power spectrum Vave(n, f) of the voice is similar to that in the first embodiment.

According to this embodiment, the difference between the power of the voice and the power of the surrounding noise is used as the frequency characteristic of the voice. Thus, even in a case where the environment is noisy, it is possible to adjust the sounds appropriately to that environment.

The aforementioned communication terminal apparatus is a mobile phone terminal, for example. The aforementioned adjustment unit can be used for not only the wired communication apparatus but also the wireless communication apparatus. For example, it can be applied to a voice transmission system such as a Voice over Internet Protocol (VoIP) system or television conference system. Moreover, the aforementioned adjustment unit may be used for the voice reproduction apparatus that do not perform the communication. For example, when the sound signals stored in the storage unit is reproduced, the read sound signals may be adjusted.

Although the embodiments of this invention were explained above, this invention is not limited to those embodiments. For example, the aforementioned functional block configuration does not always correspond to a program module configuration.

Moreover, the aforementioned storage area configuration is a mere example, and may be modified. Furthermore, as for the processing flows, as long as the processing results do not change, the order of the steps may be changed. Furthermore, the steps may be executed in parallel.

Figure 24:
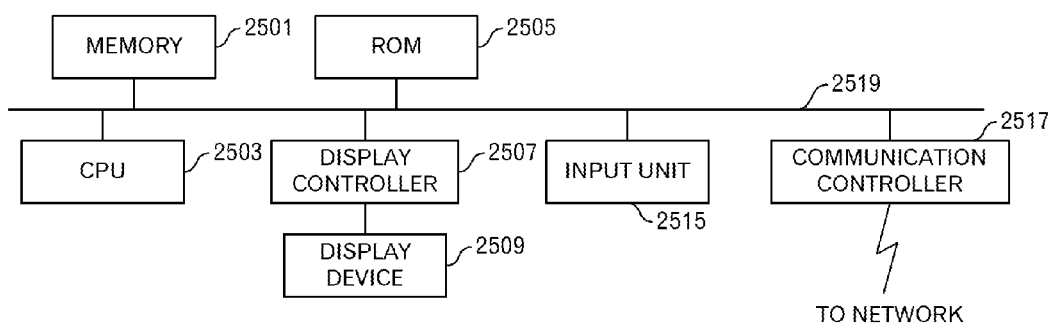
FIG. 24 is a diagram depicting a communication terminal implemented as a computer.

In addition, the communication terminal apparatus is a computer device as illustrated in FIG. 24. That is, a memory 2501 (storage device), a CPU 2503 (processor), a read only memory (ROM e.g. flash memory) 2505, a display controller 2507 connected to a display device 2509, an input device 2515, and a communication controller 2517 for connection with a network are connected through a bus 2519 as illustrated in FIG. 24. An operating system (OS) and an application program for carrying out the foregoing processing in the embodiment, are stored in the ROM 2505, and when executed by the CPU 2503, they are read out from the ROM 2505 to the memory 2501. As the need arises, the CPU 2503 controls the display controller 2507, the communication controller 2517, and the drive device 2513, and causes them to perform predetermined operations. Moreover, intermediate processing data is stored in the memory 2501, and if necessary, it is stored in the ROM 2505. Any program to realize the aforementioned function may be installed into the ROM 2505 via the network such as the Internet and the communication controller 2517. In the computer as stated above, the hardware such as the CPU 2503 and the memory 2501, the OS and the application programs systematically cooperate with each other, so that various functions as described above in details are realized.

The aforementioned embodiments are outlined as follows:

An adjustment apparatus relating to embodiments includes: (A) a calculation unit that calculates a ratio between a first frequency characteristic in a first frequency bandwidth of voice signals and a second frequency characteristic in a second frequency bandwidth of the voice signals, which is higher than the first frequency bandwidth, and calculates an adjustment amount for adjusting at least a portion of a frequency characteristic of the voice signals so that the calculated ratio approaches a predetermined reference, when the calculated ratio does not satisfy the predetermined reference; and (B) a modification unit that modifies at least the portion of the frequency characteristic of the voice signals according to the adjustment amount.

According to this adjustment apparatus, it is possible to dissolve difficulty in hearing, which is caused by balance of the frequency characteristics in two frequency bandwidths of the voice signals.

In addition, the first frequency bandwidth may be a bandwidth on a low frequency side in a voice frequency range, and the second frequency bandwidth may be a bandwidth near a center of the voice frequency range. Furthermore, (a1) the aforementioned calculation unit may calculate an adjustment amount for adjusting so as to decrease a first ratio of a second representative value of a second spectrum for the second frequency bandwidth to a first representative value of a first spectrum for the first frequency bandwidth, when the first ratio is greater than a first predetermined reference value.

Thus, it is possible to dissolve the difficulty in the hearing, which is caused by "lightness", which occurs when a ratio of the representative value of the spectrum for the frequency bandwidth near the center to the representative value of the spectrum for the bandwidth on a low frequency side is high.

Furthermore, the first frequency bandwidth may be a bandwidth on a low frequency side in a voice frequency range, and the second frequency bandwidth may be a bandwidth on a high frequency side in the voice frequency range. In such a case, (a2) the aforementioned calculation unit may calculate an adjustment amount for adjusting so as to decrease a second ratio of a first representative value of a first spectrum for the first frequency bandwidth to a second representative value of a second spectrum for the second frequency bandwidth, when the second ratio is greater than a second predetermined reference value.

According to this configuration, it is possible to dissolve the difficulty in the hearing, which is caused by the "feeling of muffled sounds", which occurs when a ratio of the representative value of the spectrum for the bandwidth on the low frequency side to the representative value of the spectrum for the bandwidth on the high frequency side is high.

The adjustment amount may be an adjustment amount for at least a portion of the second frequency characteristic for the second frequency bandwidth.

Thus, the frequency characteristics for the bandwidth on the high frequency side is adjusted. Therefore, the frequency characteristic for the bandwidth on the low frequency side is not adjusted. Typically, the sound volume on the low frequency side is greater. Therefore, it is possible to suppress change of the entire sound volume, which is caused by the adjustment.

An adjustment apparatus relating to another mode of the embodiments includes: (C) a calculation unit that calculates a first ratio between a first frequency characteristic in a first frequency bandwidth of voice signals and a second frequency characteristic in a second frequency bandwidth of the voice signals, which is higher than the first frequency bandwidth, calculates a second ratio between the first frequency characteristic and a third frequency characteristic in a third frequency bandwidth of the voice signals, which is higher than the second frequency bandwidth, calculates an adjustment amount for adjusting at least a portion of a frequency characteristic of the voice signals so that the calculated first ratio approaches a first reference, when the calculated first ratio does not satisfy the first reference, or so that the calculated second ratio approaches a second reference, when the calculated second ratio does not satisfy the second reference; and (D) a modification unit that modifies at least the portion of the frequency characteristic of the voice signals according to the adjustment amount.

According to this configuration, it is possible to dissolve the difficulty in the hearing, which is caused by the balance in the frequency characteristic between the first frequency bandwidth and the second frequency bandwidth, which is higher than the first frequency bandwidth and the difficulty in the hearing, which is caused by the balance in the frequency characteristic between the first frequency bandwidth and the third frequency bandwidth, which is higher than the second frequency bandwidth.

Moreover, the first frequency bandwidth may be a bandwidth on a low frequency side in a voice frequency range, the second frequency bandwidth may be a bandwidth near a center of the voice frequency range, and the third frequency bandwidth may be a bandwidth on a high frequency side in the voice frequency range. Furthermore, the first ratio may be a ratio of a second representative value for the second frequency bandwidth to a first representative value of a first spectrum for the first frequency bandwidth, and the second ratio may be a ratio of the first representative value of the first spectrum for the first frequency bandwidth to a third representative value of the third spectrum for the third frequency bandwidth. In such a case, (c1) the calculation unit may calculate a first adjustment amount for adjusting so as to decrease the first ratio, when the first ratio is greater than a first predetermined reference value, and calculate a second adjustment amount for adjusting so as to decrease the second ratio, when the second ratio is greater than a second predetermined reference value.

Thus, it is possible to dissolve the difficult in the hearing, which is caused by the "lightness", which occurs when the first ratio is high, and dissolve the difficulty in the hearing, which is caused by the "feeling of muffled sound", which occurs when the second ratio is high.

In addition, the first adjustment amount may be an adjustment amount for at least a portion of the second frequency characteristic for the second frequency bandwidth, and the second adjustment amount may be an adjustment amount for at least a portion of the third frequency characteristic for the third frequency bandwidth.

According to this configuration, the frequency characteristics for the bandwidth on the high frequency side and the bandwidth near the center are adjusted. Therefore, the frequency characteristic for the bandwidth on the low frequency side is not adjusted. Typically, because the sound volume for the low frequency side is greater, it is possible to suppress the change of the entire sound volume by the adjustment.

Furthermore, the aforementioned representative value may be an average value.

Thus, it is possible to appropriately evaluate the strengths of the sounds in each frequency bandwidth.

The aforementioned calculation unit may calculate a ratio by using the smoothed frequency characteristic.

By doing so, it is possible to remove the influence by the fluctuation of the voices.

Moreover, the aforementioned calculation unit may calculate a ratio by using a portion of the frequency characteristic of the voice signal, which exceeds a frequency characteristic of surrounding noise signals.

According to this configuration, it is possible to appropriately adjust the voices by removing the influence by the surrounding noises.

Furthermore, the adjustment apparatus may further a correction unit that calculates a SN ratio of input signals including sections of the voice signals and sections of noise signals, and corrects the adjustment amount based on the calculated SN ratio.

Thus, it is possible to adjust the voices according to the deterioration of the sound quality.

Furthermore, the adjustment apparatus may further include a second correction unit that calculates a magnitude of voice components for the voice signals, and corrects the adjustment amount based on the calculated magnitude of the voice components.

According to such a configuration, it is possible to adjust the voices according to the voice volume.

Incidentally, it is possible to create a program causing a processor to execute the aforementioned processing, and such a program is stored in a computer readable storage medium or storage device such as a flexible disk, CD-ROM, DVD-ROM, magneto-optic disk, a semiconductor memory, and hard disk. In addition, the intermediate processing result is temporarily stored in a storage device such as a main memory or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An adjustment apparatus comprising:
   a calculation unit that calculates a first ratio between a first frequency characteristic in a first frequency bandwidth of voice signals and a second frequency characteristic in a second frequency bandwidth of the voice signals, which is higher than the first frequency bandwidth, calculates a second ratio between the first frequency characteristic and a third frequency characteristic in a third frequency bandwidth of the voice signals, which is higher than the second frequency bandwidth, calculates an adjustment amount for adjusting at least a portion of a frequency characteristic of the voice signals so that the calculated first ratio approaches a first reference, when the calculated first ratio does not satisfy the first reference, or so that the calculated second ratio approaches a second reference, when the calculated second ratio does not satisfy the second reference; and
   a modification unit that modifies at least the portion of the frequency characteristic of the voice signals according to the adjustment amount.

2. The adjustment apparatus as set forth in claim 1, wherein the first frequency bandwidth is a bandwidth on a low frequency side in a voice frequency range,
   the second frequency bandwidth is a bandwidth near a center of the voice frequency range, and
   the third frequency bandwidth is a bandwidth on a high frequency side in the voice frequency range, and
   the first ratio is a ratio of a second representative value for the second frequency bandwidth to a first representative value of a first spectrum for the first frequency bandwidth, and
   the second ratio is a ratio of the first representative value of the first spectrum for the first frequency bandwidth to a third representative value of the third spectrum for the third frequency bandwidth, and
   the calculation unit calculates a first adjustment amount for adjusting so as to decrease the first ratio, when the first ratio is greater than a first predetermined reference value, and calculates a second adjustment amount for adjusting so as to decrease the second ratio, when the second ratio is greater than a second predetermined reference value.

3. The adjustment apparatus as set forth in claim 2, wherein the first adjustment amount is an adjustment amount for at least a portion of the second frequency characteristic for the second frequency bandwidth, and the second adjustment amount is an adjustment amount for at least a portion of the third frequency characteristic for the third frequency bandwidth.

4. The adjustment apparatus as set forth in claim 2, wherein the first to third representative values are average values.

5. An adjustment method comprising:
- calculating, by using a terminal apparatus, a first ratio between a first frequency characteristic in a first frequency bandwidth of voice signals and a second frequency characteristic in a second frequency bandwidth of the voice signals, which is higher than the first frequency bandwidth;
- calculating, by using the terminal apparatus, a second ratio between the first frequency characteristic and a third frequency characteristic in a third frequency bandwidth of the voice signals, which is higher than the second frequency bandwidth;
- calculating, by using the terminal apparatus, an adjustment amount for adjusting at least a portion of a frequency characteristic of the voice signals so that the calculated first ratio approaches a first reference, upon detecting that the calculated first ratio does not satisfy the first reference, or so that the calculated second ratio approaches a second reference, upon detecting the calculated second ratio does not satisfy the second reference; and
- modifying, by using the terminal apparatus, at least the portion of the frequency characteristic of the voice signals according to the adjustment amount.

* * * * *